(12) United States Patent
Segawa et al.

(10) Patent No.: US 10,515,999 B2
(45) Date of Patent: Dec. 24, 2019

(54) IMAGING ELEMENT, IMAGE SENSOR, IMAGING APPARATUS, AND INFORMATION PROCESSING APPARATUS

(71) Applicant: SONY INTERACTIVE ENTERTAINMENT INC., Tokyo (JP)

(72) Inventors: Hiroyuki Segawa, Kanagawa (JP); Hidehiko Ogasawara, Tokyo (JP)

(73) Assignee: SONY INTERACTIVE ENTERTAINMENT INC., Tokyo (JP)

( * ) Notice: Subject to any disclaimer, the term of this patent is extended or adjusted under 35 U.S.C. 154(b) by 0 days.

(21) Appl. No.: 15/743,348

(22) PCT Filed: Aug. 5, 2016

(86) PCT No.: PCT/JP2016/073067
§ 371 (c)(1),
(2) Date: Jan. 10, 2018

(87) PCT Pub. No.: WO2017/026385
PCT Pub. Date: Feb. 16, 2017

(65) Prior Publication Data
US 2018/0204882 A1    Jul. 19, 2018

(30) Foreign Application Priority Data

Aug. 12, 2015    (JP) ................... 2015-159577

(51) Int. Cl.
*H01L 27/30*    (2006.01)
*H04N 9/04*    (2006.01)
(Continued)

(52) U.S. Cl.
CPC .............. *H01L 27/307* (2013.01); *G01J 4/04* (2013.01); *H01L 27/14* (2013.01); *H01L 27/146* (2013.01);
(Continued)

(58) Field of Classification Search
CPC ... H01L 27/307; H01L 27/286; H01L 27/146; H04N 5/35563; H04N 9/045; G02B 5/30; G01J 4/04
See application file for complete search history.

(56) References Cited

U.S. PATENT DOCUMENTS

2009/0046185 A1*  2/2009  Ota ................... H04N 5/23232
                                                   348/294
2012/0248563 A1* 10/2012  Udaka ................ H01L 51/0012
                                                   257/443
(Continued)

FOREIGN PATENT DOCUMENTS

CN        104335352 A    2/2015
JP        2002-502129    1/2002
(Continued)

OTHER PUBLICATIONS

Taiwan Office Action dated Feb. 9, 2018, from the corresponding Taiwan Application No. 105121561.
(Continued)

*Primary Examiner* — Ahmed A Berhan
(74) *Attorney, Agent, or Firm* — Katten Muchin Rosenman LLP

(57) ABSTRACT

In an imaging element 28, a first light detecting layer 12 includes organic photoelectric conversion films 38a and 38b oriented in a prescribed axial direction so that it detects a polarized component of incident light which is directed parallel to the orientation axis. The first light detecting layer 12 also has an organic photoelectric conversion film oriented in another axial direction which is arranged in a prescribed pattern on a two-dimensional plane. A second light detecting layer 16 disposed under the first light detecting layer 12 includes photoelectric conversion elements 54a and 54b and detects a polarized component which has passed through the first light detecting layer 12 and which is directed perpen-
(Continued)

dicularly to the orientation axis of the organic photoelectric conversion films 38a and 38b.

12 Claims, 18 Drawing Sheets

(51) Int. Cl.
| | |
|---|---|
| H04N 5/367 | (2011.01) |
| H04N 5/357 | (2011.01) |
| G01J 4/04 | (2006.01) |
| H01L 27/28 | (2006.01) |
| H04N 5/355 | (2011.01) |
| H04N 5/341 | (2011.01) |
| H01L 27/14 | (2006.01) |
| H01L 27/146 | (2006.01) |
| H01L 31/10 | (2006.01) |
| H01L 51/44 | (2006.01) |
| H04N 5/374 | (2011.01) |

(52) U.S. Cl.
CPC ............ *H01L 27/286* (2013.01); *H01L 31/10* (2013.01); *H01L 51/448* (2013.01); *H04N 5/341* (2013.01); *H04N 5/357* (2013.01); *H04N 5/35563* (2013.01); *H04N 5/367* (2013.01); *H04N 5/374* (2013.01); *H04N 9/045* (2013.01)

(56) References Cited

U.S. PATENT DOCUMENTS

2015/0171145 A1* 6/2015 Park .................... H04N 5/3696 250/208.1

2016/0163752 A1 6/2016 Sambongi et al.

FOREIGN PATENT DOCUMENTS

| | | |
|---|---|---|
| JP | 2006-100766 A | 4/2006 |
| JP | 2007-59515 A | 3/2007 |
| JP | 2008-135479 A | 6/2008 |
| JP | 2009-049524 A | 3/2009 |
| JP | 2011-103335 A | 5/2011 |
| JP | 2011-176525 A | 9/2011 |
| JP | 2011-199152 A | 10/2011 |
| JP | 2012-80065 A | 4/2012 |
| JP | 2012-209486 A | 10/2012 |
| JP | 2012-212978 A | 11/2012 |
| JP | 2013-183056 A | 9/2013 |
| JP | 2014-57231 A | 3/2014 |
| JP | 2015-41793 A | 3/2015 |
| WO | 99/39395 | 8/1999 |
| WO | 2009/147814 | 12/2009 |

OTHER PUBLICATIONS

International Search Report and Written Opinion dated Sep. 6, 2016, from the corresponding PCT/JP2016/073067.

Xiaowei. He, et al., "Photothermoelectric p-n Junction Photodetector with Intrinsic Broadband Polarimetry Based on Macroscopic Carbon Nanotube Films," ACS Nano 7, 7271 (2013).

International Preliminary Report on Patentability dated Feb. 13, 2018, from the corresponding PCT/JP2016/073067.

Notification of Reason for Refusal dated Aug. 6, 2019, from Japanese Patent Application No. 2015-159577.

\* cited by examiner (a)    (b)

(a)

(b)

IMAGING ELEMENT, IMAGE SENSOR, IMAGING APPARATUS, AND INFORMATION PROCESSING APPARATUS

TECHNICAL FIELD

The present invention relates to a technology to acquire image data by means of an imaging element capable of selectively acquiring optical components.

BACKGROUND ART

There is a polarization camera of practical use which is provided with a sensor having a polarizing filter placed thereon so that it is capable of acquiring polarization information about an object. The polarization camera permits acquiring the information of the planer orientation of an object and the presence of transparent objects. This facilitates the recognition of objects and the detection of foreign matters. Consequently, the polarization camera is expected to find a broad range of use as an inspection device in a production line and an on-board camera, for example (refer to PTL 1 and PTL 2, for example).

CITATION LIST

Patent Literature

[PTL 1]
JP 2012-80065A
[PTL 2]
JP 2014-57231A

SUMMARY

Technical Problem

The polarization camera is limited with respect to the information it can acquire and hence is naturally limited in its application area, because it works on the principle that it selectively detects the optical components which have passed through the polarizing filter having an axis of polarization in a specific direction. On the other hand, the polarization camera can acquire the information of planer orientation, which is useful for various kinds of information processing through image analysis. Thus, there is an increasing demand for the technology that can be easily applied to such processing.

The present invention has been completed in view of the foregoing. It is an object of the present invention to provide a technology that permits easily obtaining various kinds of information about objects including polarization information.

Solution to Problem

One aspect of the present invention relates to an imaging element. The imaging element includes: a first light detecting layer configured to contain an organic photoelectric conversion film which is capable of passing light and is oriented in a prescribed axial direction; and a second light detecting layer disposed under the first light detecting layer and configured to contain an inorganic photoelectric conversion element.

Another aspect of the present invention relates to an image sensor. The image sensor includes: a pixel unit configured to have the imaging elements having the foregoing characteristics arranged in a matrix pattern; and a control unit configured to drive the imaging elements constituting the pixel unit in a prescribed sequence, thereby acquiring electrical signals, and output the electrical signals sequentially.

Another aspect of the present invention relates to an imaging apparatus. This imaging apparatus includes: an input unit configured to acquire from the image sensor having the foregoing characteristics data of an image including electrical signals from each detecting layer as a pixel value; and an image generating unit configured to adjust a scale of a plurality of images expressed by the image data and perform prescribed computation based on the pixel value in corresponding regions, thereby generating data of an image for output.

Another aspect of the present invention relates to an information processing apparatus. This information processing apparatus includes: the imaging apparatus having the foregoing characteristics; a memory configured to store data of images of several kinds which is output from the imaging apparatus; and an output data generating unit configured to perform information processing by using the data of images stored in the memory and generate output data that represents the results.

Incidentally, what are obtained by translating arbitrary combinations of the above constituent elements and expressions of the present invention among method, apparatus, and so forth are also effective as aspects of the present invention.

Advantageous Effect of Invention

The present invention permits easily acquiring through photographing a variety of information about objects including polarization information.

DESCRIPTION OF EMBODIMENT

Figure 1:
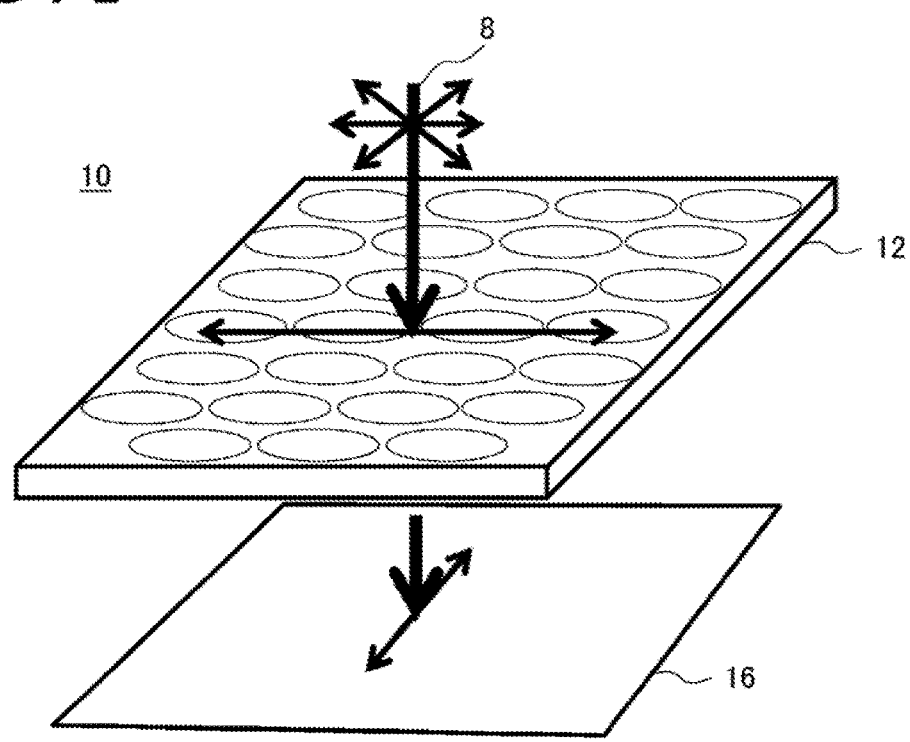
FIG. 1 is a schematic diagram of an imaging element according to one embodiment.

The imaging element according to a present embodiment is schematically depicted in FIG. 1. An imaging element 10 includes a first light detecting layer 12 and a second light detecting layer 16. The first light detecting layer 12 has a structure including a polarization organic photoelectric conversion film and transparent electrodes holding it between them. The polarization organic photoelectric conversion film absorbs the polarized component in a specific orientation, thereby generating charges, and passes the remaining polarized component. The second light detecting layer 16 has a structure of the ordinary semiconductor element, such as charge coupled device (CCD) image sensor and complementary metal oxide Semiconductor (CMOS) image sensor.

The polarization organic photoelectric conversion film, as a constituent of the first light detecting layer 12, includes an organic photoelectric conversion material which is oriented in a specific direction. The polarization organic photoelectric conversion film absorbs the polarized component of an incident light 8 which is parallel to the orientation axis (absorption long axis), thereby converting into charges. It passes the other polarized component in the direction perpendicular to the orientation axis; the polarized component which has passed undergoes photoelectric conversion by the second light detecting layer 16. Information about the amount of charges generated by the two layers permits one to detect the amount of polarized components in the two directions at the same position. Thus, the result of detection completely agrees with the amount of the incident light 8.

Figure 2:
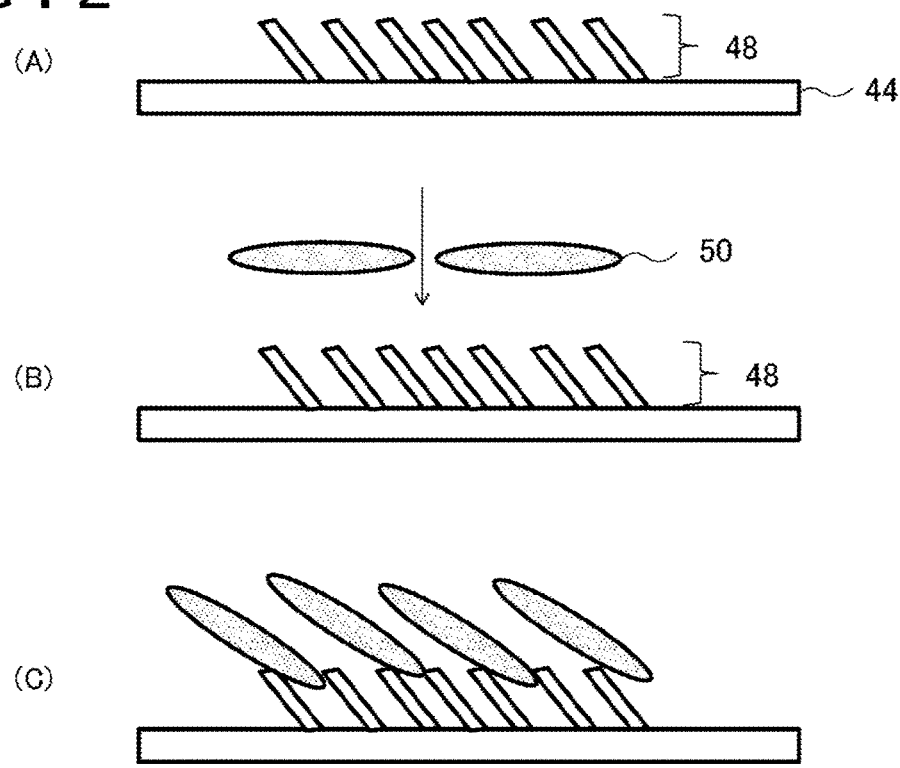
FIG. 2 is a schematic diagram of a method for forming a polarization organic photoelectric conversion film of a first light detecting layer according to the embodiment.

The polarization organic photoelectric conversion film of the first light detecting layer 12 is produced by the method schematically depicted in FIG. 2. This method starts with coating a transparent lower electrode 44 with an orientation control layer 48 which is formed from $SiO_2$ by vacuum oblique deposition, as depicted in Part (A). Next, the orientation control layer 48 is coated with an organic dye 50 which absorbs light anisotropically, as depicted in Part (B). The foregoing steps give rise to the organic dye film which orients in a specific direction, as depicted in Part (C). Orientation in a specific axial direction may be accomplished by any known method, such as lapping, stretching, forming by means of fine trenches, and usage of light orienting film. The organic photoelectric conversion material to be made into the polarization organic photoelectric conversion element is available in various types according to the waveband of light to be detected. Adequate materials and their synthesis methods are disclosed in JP 2012-209486A.

Figure 3:
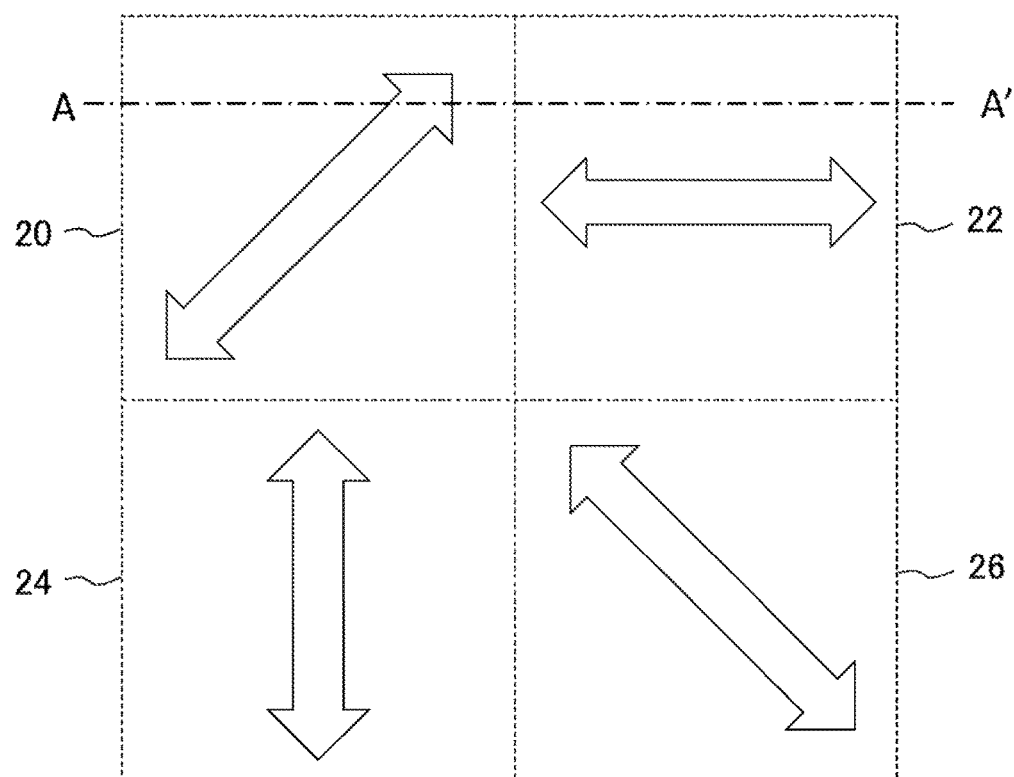
FIG. 3 is a diagram depicting a layout example in the first light detecting layer according to the embodiment where a plurality of regions having organic photoelectric conversion films differing in orientation axis are arranged close to each other.

The foregoing technique is employed in the present embodiment in order to form the organic photoelectric conversion film in which individual unit regions vary in the orientation. The organic photoelectric conversion film in the first light detecting layer 12 including unit regions which are arranged as depicted in FIG. 3 which is an overhead view. It is to be noted that the adjoining four unit regions vary in the orientation axis which is indicated by the arrows. The depicted example includes four regions 20, 22, 24, and 26 which are arranged in two columns and two rows such that they differ from one another in the orientation axis.

The regions depicted in FIG. 3 are arranged such that two regions on the diagonal line have their orientation axes being perpendicular to each other and two regions adjoining horizontally or vertically have their orientation axes being aslant at an angle of 45°. In other words, the four regions are arranged such that their orientation axes are aslant to each other at an angle of 45°. Each region has the organic photoelectric conversion film which absorbs the polarized component parallel to the orientation axis and passes the polarized component perpendicular to the orientation axis. As the result, the second light detecting layer 16 placed thereunder absorbs the polarized components varying in the orientation axis by 45° which crosses at right angles in the regions corresponding to the four regions 20, 22, 24, and 26 of the first light detecting layer 12.

The four unit regions mentioned above constitute a group of unit regions, and as many groups as necessary are arranged in the vertical and horizontal directions, so that each unit region (or a region smaller than that) corresponds to each pixel that detects light. This makes it possible to obtain the polarization information in the two directions for one position and to obtain the polarized image which indicates the polarization information in the four directions at the neighboring positions. In this way it is possible to detect the incident light without loss in the entire system because the polarized components which have not been absorbed by the first light detecting layer 12 is detected by the second light detecting layer 16.

Figure 4:
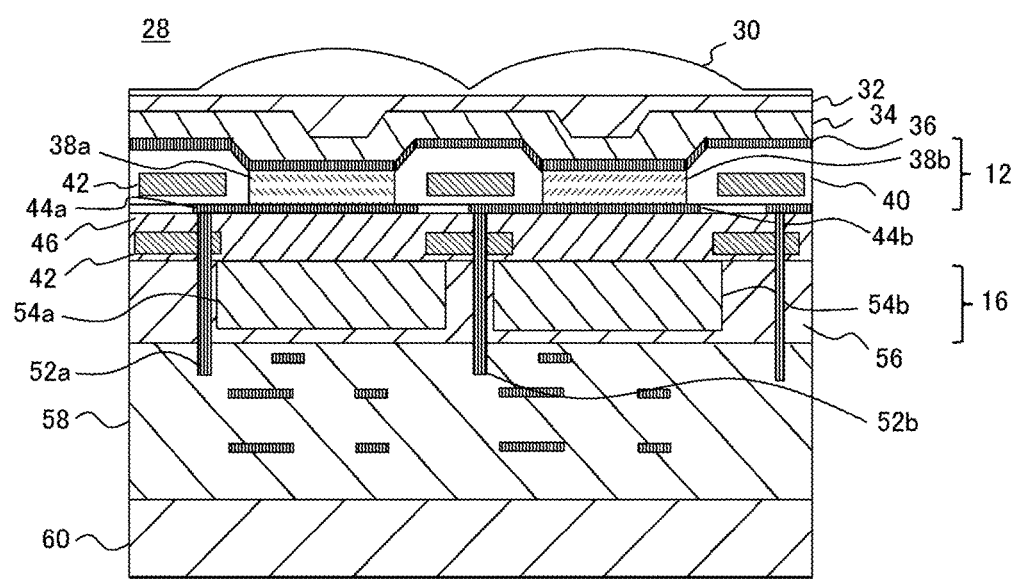
FIG. 4 is a sectional view depicting a structure of the imaging element according to the embodiment.

The imaging element according to the present embodiment is constructed as depicted in FIG. 4 which is a sectional view. An imaging element 28 is intended to acquire an image of gray scale. Moreover, the imaging element 28 includes the second light detecting layer 16, the first light detecting layer 12, and an on-chip lens 30, which are laminated one over another on a multilayer wiring layer 58 (which is intended to transfer the result of detection in the form of electrical signals). The entire laminate structure is backed with a supporting substrate 60. The first light detecting layer 12 includes organic photoelectric conversion films 38a and 38b (which perform photoelectric conversion on the polarized component with a specific direction), an upper electrode 36 and lower electrodes 44a and 44b (which apply a voltage to it, thereby taking out signal charges), and an inorganic insulating film 40.

Each of the lower electrodes 44a and 44b is formed in each region corresponding to the pixel, and they are isolated from each other by the inorganic insulating film 40. The lower electrodes 44a and 44b have conductive plugs 52a and 52b connected thereto which lead to the multilayer wiring layer 58, so as to read out the charges generated as the result of photoelectric conversion by the organic photoelectric conversion films 38a and 38b. The charges which have passed through the conductive plugs 52a and 52b are accumulated in a charge accumulating layer (not depicted) and then read out at an appropriate timing. The upper electrode 36 is connected to and given a voltage by the multilayer wiring layer 58 through a contact metal layer (not depicted). The organic photoelectric conversion films 38a and 38b absorb the polarized components differing in the direction from one region to another, perform photoelectric conversion, and pass the remaining polarized components, as mentioned above.

The organic photoelectric conversion films 38a and 38b include such material as quinacridone derivative, naphthalene derivative, anthracene derivative, and conjugated polymer, in such a way that the material is oriented in a specific direction. Incidentally, FIG. 4 is a sectional view taken along the chain line A-A' in FIG. 3. The organic photoelectric conversion film 38a on the left side of FIG. 4 includes an organic pigment which has the orientation axis in the direction indicated in the region 20 in FIG. 3. The organic photoelectric conversion film 38b on the right side of FIG. 4 includes an organic pigment which has the orientation axis in the direction indicated in the region 22 in FIG. 3. In addition, the polarization organic photoelectric conversion film is formed (in the depth direction) from the organic pigment which orients in the direction of the regions 24 and 26 as indicated in FIG. 3. As the result, there is obtained the polarized organic photoelectric conversion film which has a layout as depicted in FIG. 3 (which is an overhead view).

The organic photoelectric conversion films 38a and 38b are not restricted to a specific color in the case where they are intended to acquire images of gray scale; it is possible to use any pigment which absorbs a broader range of waveband. The material and structure for this purpose are practically used in the field of photovoltaic power generation. For example, the material that absorbs visible light over a broad waveband is disclosed in JP-T 2002-502129, which includes polymers, such as polythienylene vinylene (PTV) and polyvinylcarbazole (PVK), optionally mixed with organic molecules.

In the case where it is necessary to detect only a specific waveband for a specific color and obtain color images (as mentioned later), there is the known technique and material to control the waveband for absorption. Some examples are disclosed in JP-T 2002-502129, JP 2011-199152A, JP 2013-183056A, and JP 2007-59515A. The upper electrode 36 and the lower electrodes 44a and 44b include optically transparent inorganic conductive films, such as ITO (indium tin oxide) and TO (tin oxide).

An inorganic insulation film 40 is formed in a lattice pattern from such material as silicon oxide, silicon nitride, and silicon oxynitride (SiON), between the lower electrode 44 (corresponding to the pixel) and the organic photoelectric conversion film 38 thereunder. The inorganic insulation film 40 has a shading layer 42 formed therein, which shuts out incident light in the lateral direction. The shading layer 42 includes any one of tungsten, titanium, aluminum, and copper, and nitride thereof, which has a material with low visible light transmission.

The first light detecting layer 12 is sequentially coated with a protective film 34, a planarized layer 32, and the on-chip lens 30. The protective film 34 includes any light-transmitting inorganic material, such as silicon oxide, silicon nitride, and silicon oxynitride. The planarized layer 32 includes any light-transmitting resin, such as acrylic resin, styrene resin, and epoxy resin. Note that the protective layer 34 may also function as the planarized layer 32. The on-chip lens allows the incident light to converge on each of the pixel regions of the first light detecting layer 12.

The first light detecting layer 12 is on the second light detecting layer 16, with an interlayer insulating film 46 interposed between them. The interlayer insulating film 46 has the shading layer 42, which shuts out the lateral incident light to the second light detecting layer 16. The second light detecting layer 16 is so constructed as to have photoelectric conversion elements 54a and 54b (corresponding to each pixel) embedded in a silicon substrate 56. Incidentally, in the case depicted in FIG. 4, the second light detecting layer 16 is constructed such that the organic photoelectric conversion films 38a and 38b differing in the orientation axis in the first light detecting layer 12 have the lower electrodes 44a and 44b corresponding to the pixels of the first light detecting layer 12 and also have the photoelectric conversion elements 54a and 54b corresponding to the pixels of the second light detecting layer 16.

As mentioned above, the lower electrodes and the photoelectric conversion element are provided (in the depthwise direction) for individual films differing in the orientation axis, as depicted in FIG. 4. This arrangement permits the first light detecting layer 12 and the second light detecting layer 16 to have one each pixel in the four directional orientation axes. However, as will be mentioned later, it is not always necessary for the pixel of the first light detecting layer 12 and the pixel of the second light detecting layer 16 to correspond to each other. Moreover, as will be mentioned later, in the case where it is necessary to acquire color images, a color filter may be attached to the top layer of the first light detecting layer 12 or the second light detecting layer 16.

A plurality of the imaging element 28 depicted in FIG. 4 are arranged in a matrix pattern in the lateral direction and the depthwise direction in FIG. 4, and they are connected to the peripheral circuits that control the charge read-out timing, so as to construct the image sensor that acquires at least two kinds of optical information simultaneously in the form of two-dimensional data. The peripheral circuits that control the charge read-out timing may be any one which is commonly used for image sensors. However, it is necessary to read out two identical peripheral circuits so that they read out simultaneously the image which has as the pixel value the value detected by the first light detecting layer 12 and the image which has as the pixel value the value detected by the second light detecting layer 16.

Figure 5:
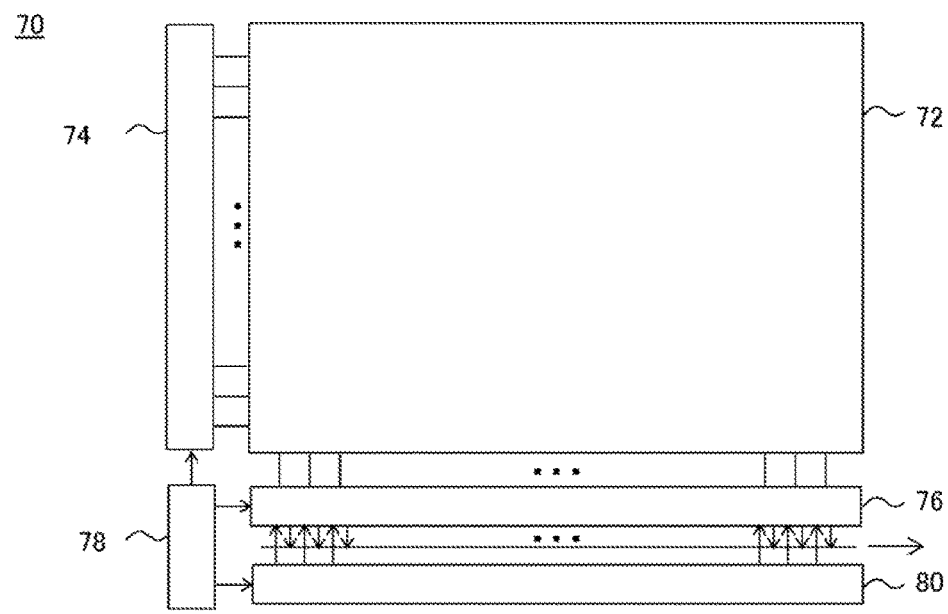
FIG. 5 is a schematic diagram depicting a structure of an image sensor according to the embodiment.

The image sensor according to the present embodiment is constructed as depicted in FIG. 5. An image sensor 70 includes a pixel unit 72, a row scanning unit 74, a horizontal selecting unit 76, a column scanning unit 80, and a control unit 78 (with the last four units functioning as the peripheral circuits). The pixel unit 72 includes the plurality of imaging element 28 (as depicted in FIG. 4) which are arranged in a matrix pattern. According to the present embodiment, the first light detecting layer 12 reads out (pixel by pixel) the polarized component of charges parallel to the orientation axis of the organic photoelectric conversion film constituting it, and the second light detecting layer 16 reads out the polarized component of charges perpendicular to the orientation axis of the organic photoelectric conversion film.

FIG. 5 depicts only one of the two peripheral circuits for read out. The pixels each including known constituents such as transistors are connected to the row scanning unit 74 for each row of the pixels and also connected to the horizontal selecting unit 76 and the column scanning unit 80 for each column of the pixels, so that the scanning units read out the charges which have been generated by photoelectric conversion and accumulated in the charge accumulating layer.

The row scanning unit 74 includes the shift register and address code so that it drives the pixels row by row.

The row scanning unit 74 selects and scans the pixels and extracts signals from them and sends the signals to the horizontal selecting unit 76, which includes amplifiers and horizontal selecting switches. The column scanning unit 80 includes shift registers and address decoders, so that it operates the horizontal selecting switch of the horizontal selecting unit 76 for its sequential driving. The column scanning unit 80 performs selective scanning so as to output the signals to the external, the signals which have been supplied from individual pixels to the horizontal selecting unit 76. The control unit 78 generates timing signals to control the drive timing for the horizontal selecting unit 76 and the column scanning unit 80.

The peripheral circuits depicted in FIG. 4 include the first light detecting layer 12 for read out signal and the second light detecting layer 16 for read out signal, so that they control independently the output frame rate for the two kinds of images. The result of such control may be a difference between the frame rate of images from the first light detecting layer 12 and the frame rate of images from the second light detecting layer 16, with the former being smaller than the latter.

It may be specifically assumed that the former is 30 fps and the latter is 60 fps; then the result is the difference between the duration of accumulation of charges generated by the first light detecting layer 12 and the duration of accumulation of charges generated by the second light detecting layer 16, with the former being longer than the latter. This makes the first light detecting layer 12 improve in sensitivity. The present embodiment mentioned herein has a disadvantage that the first light detecting layer 12 is slower than the second light detecting layer 16 on account of the long distance to the multilayer wiring layer 58 from which signals are read out. This disadvantage can be overcome by independently controlling the frame rate of images from the both; thus the first light detecting layer 12 can output images smoothly while the second light detecting layer 16 is maintaining a sufficient output rate for images from it.

Figure 6:
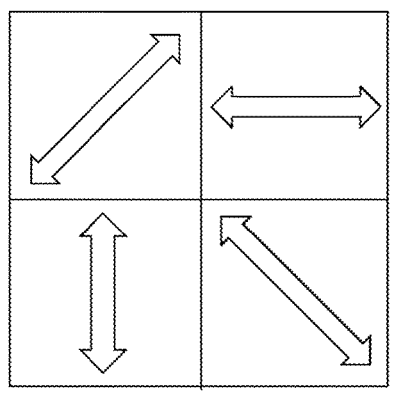
FIG. 6 is a diagram of the imaging element according to the embodiment, which illustrates the relation between a pixel array of the first light detecting layer and a pixel array of a second light detecting layer.
Figure 6:
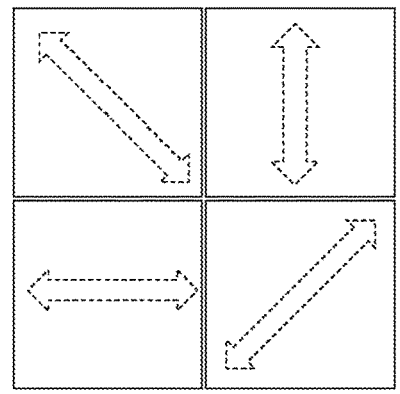

The first light detecting layer 12 and the second light detecting layer 16 in the imaging element (mentioned above) have the pixel arrays as depicted in FIG. 6. Part (a) in FIG. 6 depicts the first light detecting layer 12 including 2×2 pixel arrays, and Part (b) in FIG. 6 depicts the second light detecting layer 16 including 2×2 pixel arrays. The pixels in the first light detecting layer 12 and the second light detecting layer 16 are arranged such that each pixel corresponds to the orientation axis of the organic photoelectric conversion film of the first light detecting layer 12, as mentioned above. In other words, the first light detecting layer 12 gives, for each pixel, information about the polarized components in four directions (indicated by solid line arrows) parallel to the orientation axis, in the same way as the layout of the films in the individual orientation directions depicted in FIG. 3.

On the other hand, the second light detecting layer 16 gives, for each pixel, information about the polarized components (which have passed through the first light detecting layer 12) in four directions (indicated by dashed line arrows) perpendicular to the orientation axis. The result is that one can obtain the entire pixel arrays including the pixel arrays depicted in Part (a) of FIG. 6. In other words, the entire pixel arrays including the repeating units of 2×2 pixels each representing a gray scale image including polarized components in four directions. The entire pixel arrays also include the repeating units of 2×2 pixels each representing a gray scale image including polarized components in four directions which are depicted in Part (b) of FIG. 6. It is to be noted that the pixels depicted in Part (a) and the pixels depicted in Part (b) are perpendicular to one another at their corresponding positions. The detected values (for two-dimensional data) directly output from the imaging element are designated as a first layer detected value image (for the former) and a second layer detected value image (for the latter).

Figure 7:
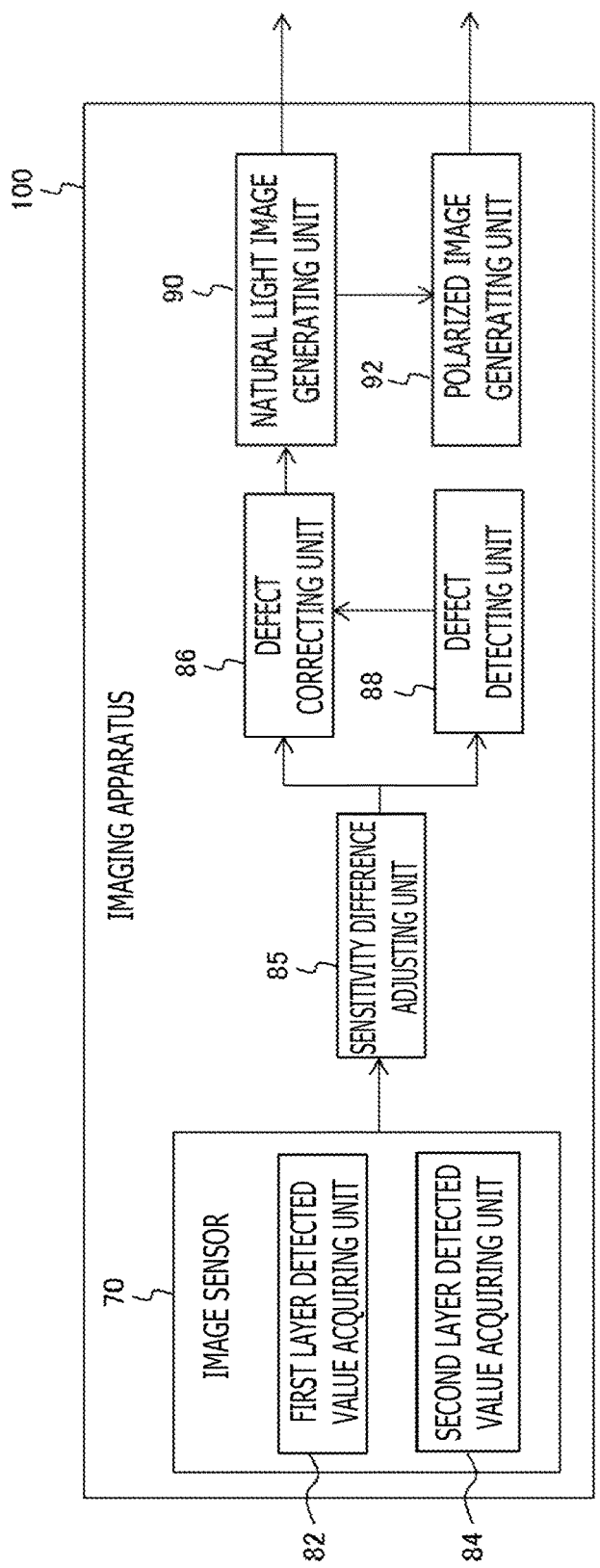
FIG. 7 is a block diagram depicting functions of an imaging apparatus according to the embodiment.

The imaging apparatus (including the image sensor 70 mentioned above) according to the present embodiment functions as illustrated by the block diagram in FIG. 7. The functions illustrated by the block diagrams in FIG. 7 and FIGS. 16 and 29 (given later) can be realized from the imaging element, arithmetic circuits, microprocessors, central processing unit (CPU), and memory in terms of hardware or from programs stored in memory (or loaded into memory from recording medium) in terms of software. Whether the desired functions are realized from hardware, software, or combination thereof is known to those skilled in the art; therefore, the present invention is not restricted in this matter.

An imaging apparatus 100 includes the image sensor 70 (including the pixel matrix), a sensitivity difference adjusting unit 85 (which adjusts data based on the difference in sensitivity of each light detecting layer), a defect detecting unit 88 (which detects defects in data), a defect correcting unit 86 (which corrects defects in defective data), a natural light image generating unit 90 (which generates natural light images), and a polarized image generating unit 92 (which generates polarized images). The image sensor 70 corresponds to the image sensor 70 depicted in FIG. 5; it includes the two-dimensional arrays of imaging elements depicted in FIG. 3 and the peripheral circuits depicted in FIG. 4. The imaging element includes the first detecting layer 12 and the second detecting layer 16 as mentioned above. Each of the detecting layers includes the value of polarized components in four directions, and the directions of polarization cross each other at the corresponding position, so that the first light detecting layer and the second light detecting layer give rise to the image data.

The image sensor 70 depicted in FIG. 7 includes a first layer detected value acquiring unit 82 and a second layer detected value acquiring unit 84. The first layer detected value acquiring unit 82 and the second layer detected value acquiring unit 84 each includes the first light detecting layer 12 and the second light detecting layer 16 and their peripheral circuits. They acquire signal charges and output them to the sensitivity difference adjusting unit 85 in a specific pixel order (i.e., raster sequence). The sensitivity difference adjusting unit 85 is necessary because the first light detecting layer 12 and the second light detecting layer 16 differ from each other in material and structure and hence they are likely to give different scale of detected values due to different sensitivity for light with the same intensity. Thus, the sensitivity difference adjusting unit 85 adjusts the scales of the first layer detected value image and the second layer detected value image so that they can be compared or added correctly in the subsequent processing.

To be more specific, each pixel value of first layer detected value image, or the value $O(x,y)$ detected by the first light detecting layer 12, is multiplied by a coefficient $k(x,y)$ as follows so as to give the converted value $Ocon(x,y)$ which makes the scale meet the sensitivity of the second light detecting layer 16.

$$Ocon(x,y)=k(x,y) \times O(x,y)$$

Here, $(x,y)$ denotes the coordinate of the pixel in the two-dimensional array. The coefficient $k(x,y)$ is determined as follows by initial calibration or calibration prior to operation of the imaging apparatus 100. The first step is to photograph a uniform gray surface of object covering the entire field of view, the object being uniformly illuminated with an unpolarized light source. Next, the coefficient $k(x,y)$ is determined such that the converted value of the detected value from the first light detecting layer 12 coincides with the detected value from the second light detecting layer 16.

Assuming that the detected value $Oin(x,y)$ from the first light detecting layer 12 and the detected value $Sin(x,y)$ from the second light detecting layer 16 have been obtained under the foregoing conditions, then $k(x,y)$ is calculated which satisfies the following.

$$Sin(x,y)=k(x,y) \times Oin(x,y)$$

The coefficient $k(x,y)$ in this case may be replaced by the constant k (which is independent of the coordinate of the pixel position) if it is within a prescribed range throughout the entire images. For example, the constant k may be determined by dividing $\Sigma Sin(x,y)$ by $\Sigma Oin(x,y)$, with the former denoting the sum of the pixel values throughout the entire second layer detected value image, and the latter denoting the sum of the pixel values throughout the entire first layer detected value image.

The sensitivity difference adjusting unit 85 multiplies by the thus determined coefficient k each pixel value of first layer detected value images which has been output from the first layer detected value acquiring unit 82 of the image sensor 70, thereby performing scale adjustment. The result is output, together with the data of second layer detected value images, to the defect detecting unit 88 and the defect correcting unit 86. Incidentally, in what follows, the data which has undergone scale adjustment will be referred to as "first layer detected value image."

The defect detecting unit 88 detects any defect (anomalous value) which might exist in the detected value. This step is based on the fact that the sum of two kinds of polarized components (with their directions perpendicular to each other) represents unpolarized light (or natural light). The procedure for this step includes adding one detected value of two sets of polarized components perpendicular to each other to another detected value of two sets of polarized components perpendicular to each other and comparing with each other. The two sets of polarized components are selected from the 2×2 pixel array (having polarized components in four directions) depicted in Part (a) or (b) in FIG. 6. The two detected values should have approximately the same value representing the incident light at an approximately same position; therefore, the existence of a large difference suggests a defect in the detected value.

When the defect detecting unit 88 detects any defect, the defect correcting unit 86 complements the defect with the help of the values of surrounding pixels. The proper complement processing is based on the cause of defects which is inferred from the data in the same region of the first layer detected value image and the second layer detected value image. If the defect detecting unit 88 does not detect any defect, the defect correcting unit 86 outputs, without further processing, the data of polarized components acquired from the sensitivity difference adjusting unit 85 to the natural light image generating unit 90.

The natural light image generating unit 90 acquires the data of detected value images from the two layers which has undergone adjustment and defect correction, and then it generates, based on this data, the image of luminance of natural light which is to be output eventually. In other words, it adds together the pixel value of first layer detected value images, which has undergone scale adjustment, and the pixel value of second layer detected value images. This step is achieved in such a way that pixels at the corresponding positions are combined together, so that the original incident light is restored. The natural light image generating unit 90 generates the data of luminance image of natural light and outputs this data to the memory apparatus or the image processing apparatus connected to the imaging apparatus 100 according to need. Moreover, the natural light image generating unit 90 outputs the data of luminance image of natural light to the polarized image generating unit 92 together with the data of first layer detected value image, which has undergone scale adjustment, and the data of second layer detected value image.

The polarized image generating unit 92 utilizes the above-mentioned data, thereby generating polarized images differing in the direction. To be more specific, this procedure is performed as follows. First, the polarized component in each direction is obtained, which is expressed in terms of discrete values that depend on the arrangement of the film differing in the orientation axis. Then, the detected values of the polarized component in each direction undergo interpolation, so that the polarized images of two layers are generated for each direction. The resulting data for two layers (in the same direction) are added together. The interpolation includes the addition of the high-frequency component of the luminance image resulting from natural light. This procedure restores the details of the image represented by the high-frequency component. Finally, the polarized image generating unit 92 outputs the data of the resulting polarized image to the memory apparatus or the image processing apparatus connected to the imaging apparatus 100 according to need.

Figure 8:
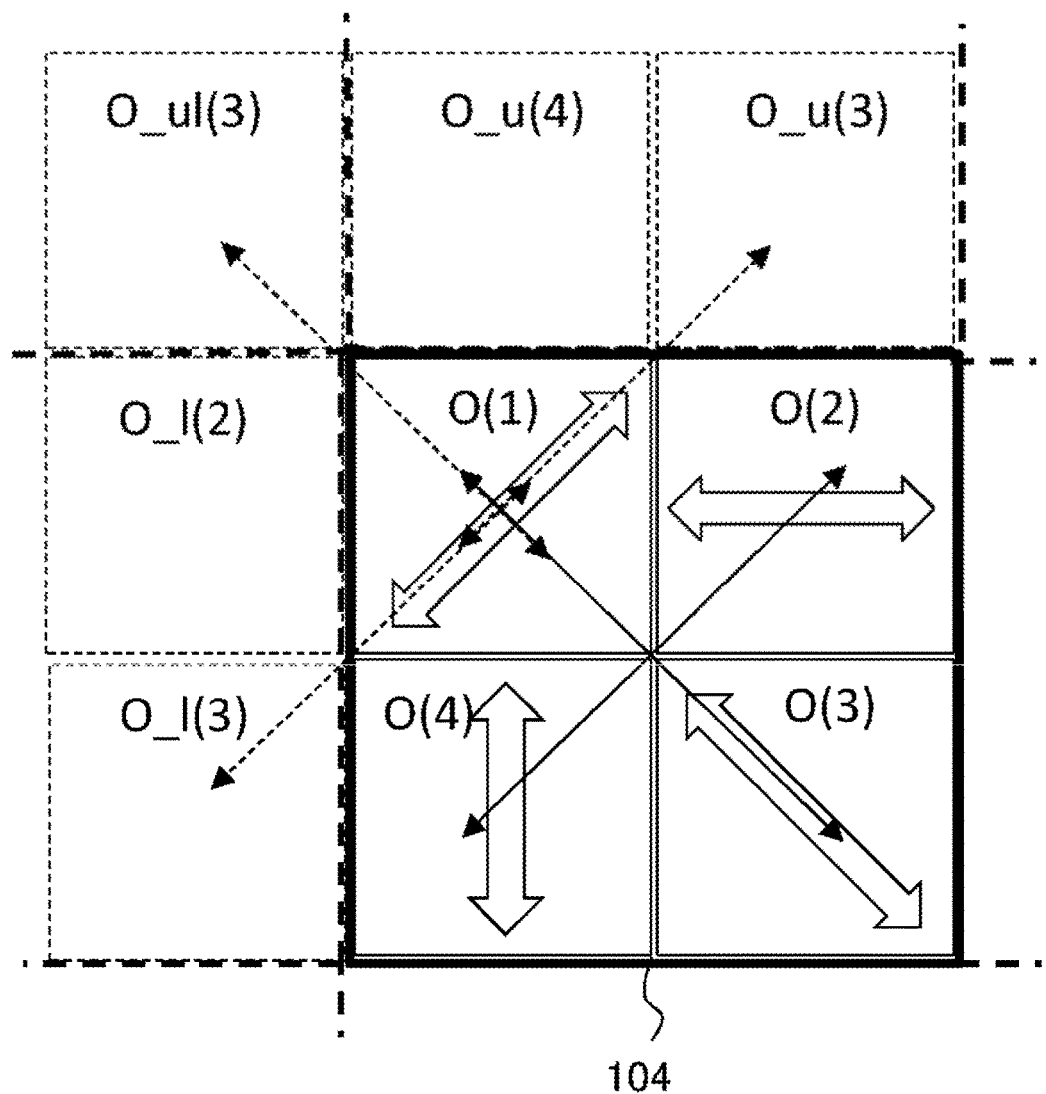
FIG. 8 is a diagram to explain how a defect detecting unit detects and a defect correcting unit corrects defective data according to the embodiment.

The defect detecting unit 88 and the defect correcting unit 86 respectively detects and corrects defects in data as illustrated in FIG. 8. FIG. 8 depicts the first layer detected value image. The box surrounded by thick lines in FIG. 8 represents a pixel array 104 of 2×2 to detect the polarized components in four directions from the first layer detected value image. One rectangle in the box corresponds to one pixel. Each of four pixels constituting the pixel array 104 gives the detected value of the polarized component in the direction indicated by the open arrow. Incidentally, FIG. 8 depicts additional pixels on the left and upper sides (separated by dashed lines) of the pixel array 104 for the purpose of explanation that will be given later.

FIG. 8 depicts that the polarized components which have been detected as mentioned above have the directions which incline at angles of 45°, 90°, 135°, and 180° from the vertical axis as if the pixels of the pixel array 104 rotate in the order of upper left, upper right, lower right, and lower left. In what follows, these directions will be referred to as the first direction, the second direction, the third direction, and the fourth direction. Incidentally, FIG. 8 depicts an example of the arrangement of first layer detected value images. By contrast, FIG. 6 depicts that second layer detected value image represents the corresponding pixel with detected value of polarized component in the direction perpendicular to them. The fact that the sum of polarized components in the directions which are perpendicular to each other represents the original natural light as mentioned above, suggests that the sum of the detected values of the polarized components in the first direction and the third direction represents the approximately the same value of the sum of the detected values in the second direction and the fourth direction. This characteristic is utilized to detect defects in the pixel.

The foregoing will be described in more specifically. Assuming that the pixel array 104 of the first layer detected value image includes pixels having the value of O (or the number of the direction) indicated by the solid line arrows in FIG. 8 and that the detected values of polarized components in the directions perpendicular to each other are such that their sum O(1)+O(3) and their sum O(2)+O(4) by a value ($\Delta O$) exceeding a prescribed threshold value, the defect detecting unit 88 makes a decision that any one of the pixels has defects. The foregoing is applied also to the second layer detected value image. That is, assuming that each pixel in the 2×2 pixel array has a value of S (or the number of the direction) and that the difference ($\Delta S$) between the sum S(1)+S(3) and the sum S(2)+S(4) exceeds a prescribed value, the defect detecting unit 88 decides that any one of the pixels has defects.

Figure 9:
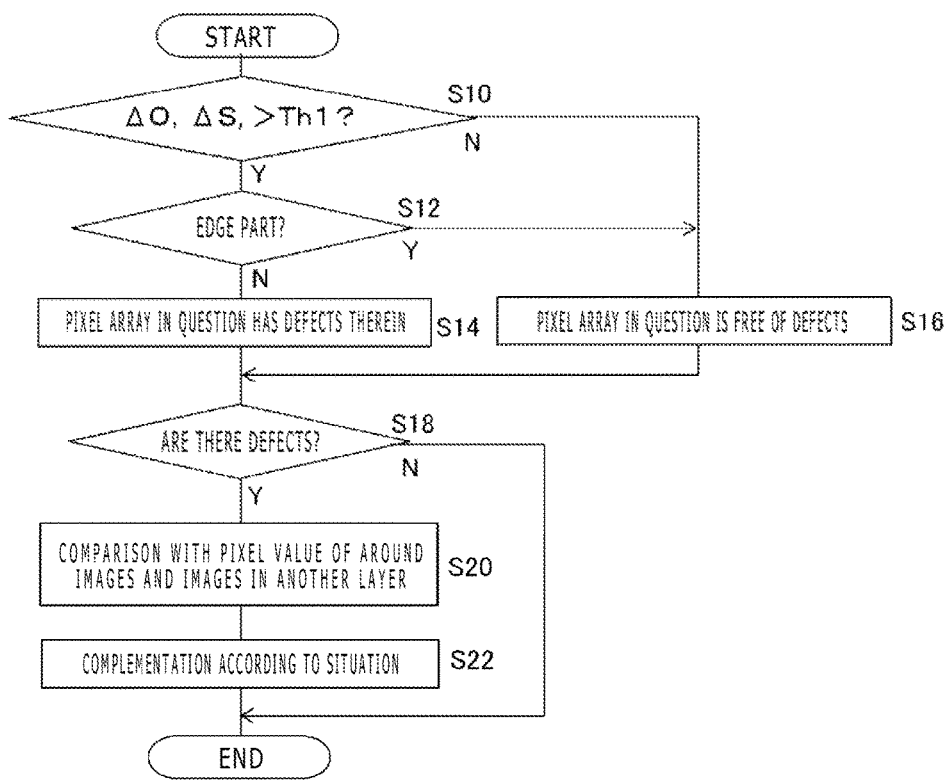
FIG. 9 is a flowchart depicting in detail a procedure by which the defect detecting unit detects and the defect correcting unit complements defective data according to the embodiment.

In response to the foregoing decision, the defect correcting unit 86 confirms the values of pixels around the pixel with the detected value images in identical layer and also confirms the values of the pixel at the same position as and around the pixel with the detected value images in another layer, and it specifies the pixel with defects in the pixel array which has been decided to have detects and determines the pixel value to be complemented. FIG. 9 is a flowchart depicting in detail the procedure for defect detection and complement to be performed by the defect detecting unit 88 and the defect correcting unit 86. The procedure depicted in the flowchart is performed on the first layer detected value image and the second layer detected value image for the 2×2 pixel arrays one by one. First, the defect detecting unit 88 confirms whether or not the value of $\Delta O$ or $\Delta S$ (mentioned above) exceeds the threshold value Th1. If the answer is negative, it decides that the pixel array in question is free of defects (N of S10 and S16).

Even though $\Delta O$ or $\Delta S$ exceeds the threshold value (Y of S10), it decides that the pixel array in question is free of defects (Y of S12 and S16) if the pixel array in question includes the edge part as the image. The reason for this is that $\Delta O$ or $\Delta S$ becomes partly large irrespective of defects because the edge part representing the border of the image of an object is likely to vary qualitatively and rapidly in pixel value. According to this decision, the defect detecting unit 88 detects edges in the usual way for the detected value images by the first layer and the second layer. In the case where $\Delta O$ or $\Delta S$ exceeds the threshold value (Y of S10) and the pixel array in question does not include the edge part (N of S12), the defect detecting unit 88 decides that the pixel array in question has defects therein (S14).

If the defect detecting unit 88 decides that there are no defects, the defect correcting unit 86 leaves the pixel array in question intact and outputs the original pixel value to the natural light image generating unit 90 (N of S18). If the defect detecting unit 88 decides that there are defects (Y of S18), the defect correcting unit 86 specifies the pixel having defects by comparison with the pixel value in the prescribed region indicating the polarized component in the same direction within the identical detected value images and the detected value images in another layer (S20).

A decision is made qualitatively that any pixel has defects if its value differs by more than the threshold value Th2 from the value of neighboring pixels having the polarized component in the same direction in the identical detected value images and/or the value of neighboring pixels having the polarized component in the same direction in another detected value images. There is an alternative to the foregoing. It includes estimating the pixel value in the position in question by interpolation of the pixel values within the identical detected value images or the neighboring pixel values indicating the polarized component in the same direction of another detected value image. If the estimated value differs from the actual pixel value by more than the threshold value Th2, then a decision is made that the pixel in question has defects. Then, the defect correcting unit 86 substitutes (for complement) an adequate value into the defective pixel in considering how the difference has occurred or the surrounding pixel values (S22). The complemented data is output to the natural light image generating unit 90.

The complement may possibly be performed in different ways. For example, interpolation is applied to defective images according to the neighboring pixel values denoting the polarized component in the same direction in the identical detected value images. Alternatively, interpolation is achieved by substitution of the image value denoting the polarized component in the same direction. These means may be combined with one another to determine the value for substitution. In the case of using the data in the identical detected value image, the following method will be available. If any defect is found in the pixel in the first direction among the 2×2 pixel arrays 104 of the first layer detected value image, as depicted in FIG. 8, the following procedure is practiced to obtain the correction value O'(1) by using the orthogonal relation mentioned above.

$$O'(1)=O(2)+O(4)-O(3)$$

Alternatively, the following procedure may be employed by using the value of the other neighboring 2×2 pixel arrays. For example, in the case where any defect is found in the pixels in the first direction among the pixel array 104, the sum of the pixel values in the third direction (indicated by broken line arrows) in the neighboring pixel array (indicated by the dashed line in FIG. 8) is equal to the sum of the neighboring pixel values in the direction of second direction and fourth directions. That is, the following equations hold.

$$O(1) \approx O(2)+O(4)-O(3)$$

$$O(1) \approx O\_l(2)+O\_u(4)-O\_ul(3)$$

$$O(1) \approx O(2)+O\_u(4)-O\_u(3)$$

$$O(1) \approx O\_l(2)+O(4)-O\_l(3)$$

The symbol $O\_ul(3)$ denotes the pixel value in the third direction of the upper left pixel arrays of the pixel array 104 in question. The symbols $O\_u(3)$ and $O\_u(4)$ individually denote the pixel values in the third and fourth directions of the upper pixel arrays of the pixel array 104. The symbols $O\_l(2)$ and $O\_l(3)$ individually denote the pixel values in the second and third directions of the left pixel arrays of the pixel array 104. The foregoing relation may be used to replace the appropriate value O'(1) with a value obtained by dividing the sum of the right sides of the above four formulas by four. The same interpolation as mentioned above may be applied to the pixel values in other directions and the second layer detected value images.

Figure 10:
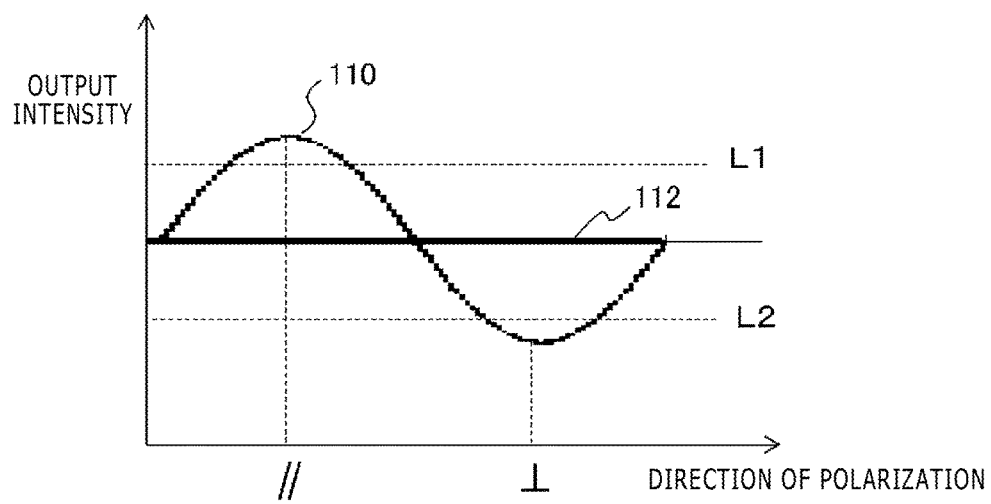
FIG. 10 is a diagram to explain a method of confirming occurrence of defects in polarization according to the embodiment.

Incidentally, the defect of the pixel includes the defect of polarization which results from the fact that the organic photoelectric conversion film of the first light detecting layer 12 is not uniformly oriented in the process of production of the imaging element. In this case it is advisable to confirm the presence or absence of the defect of polarization before shipment of the imaging element and record beforehand the position of coordinate where the defective pixel has been found. FIG. 10 illustrates how to confirm the occurrence of defects in polarization. This method is based on the following principle. When a beam of light polarizing in a known orientation is directed to the organic photoelectric conversion film of the first light detecting layer 12, the incident light is entirely absorbed in principle if it has the direction light parallel to the orientation axis of the film. Hence the first light detecting layer 12 emits an intense light. If the incident light has the direction of polarization which is perpendicular to the orientation axis, the output from the first light detecting layer 12 will be almost zero.

This idea may be developed as follows. If the incident light has its direction of polarization gradually deflected, the intensity of output will vary along the sine curve which has the maximum and minimum values in the direction of polarization, as represented by a curve 110 in FIG. 10. The maximum value occurs in the direction parallel to the orientation axis of the organic photoelectric conversion film; and the minimum value occurs in the direction perpendicular to the orientation axis of the organic photoelectric conversion film. On the other hand, if the organic photoelectric conversion film is completely free of orientation, the output intensity will be flat with respect to the direction of polarization as indicated by a straight line 112. Therefore, the output intensity is given the lower limit L1 assigned to its maximum value and the upper limit L2 assigned to its minimum value.

In order to confirm whether or not there are defects in polarization, the sample is irradiated with polarized light through rotating a polarizing plate and the first light detecting layer 12 is checked for change in output intensity for all the pixels. The fact that the output intensity gives the maximum value which does not exceed the lower limit L1 or the minimum value which does not exceed the upper limit L2 indicates that the pixels that give such output intensities are not sufficiently oriented, which leads to defects in polarization. Such pixels have their position coordinates stored in the memory attached to the image sensor, so that the defect detecting unit 88 of the imaging apparatus 100 reads out the information and specifies the pixels with defects and notifies this data to the defect correcting unit 86. In this case, too, the defect correcting unit 86 performs the process of complement in the same way as mentioned above. Incidentally, there is an alternative in which the imaging apparatus 100 itself is provided with the function to detect the defects of polarization in the same way as mentioned above.

The natural light image generating unit 90 generates, according to need, the luminance image of natural light by means of the data which has been complemented as mentioned above. This step is based on calculating the linear sum of the pixel value at each position (x,y) of the first layer detected value image and the pixel value at each position (x,y) of the second layer detected value image. In other words, the luminance Y(x,y) is calculated as follows.

$$Y(x,y)=k(x,y) \times O(x,y)+S(x,y)$$

Here, the coefficient k(x,y) may be the same coefficient k(x,y) as used in the sensitivity difference adjusting unit 85 to adjust the scale of the first layer detected value image. In this case, the luminance Y(x,y) is obtained in the following way.

$$Y(x,y)=Ocon(x,y)+S(x,y)$$

The appropriately set coefficient k(x,y) permits the original incident light to be represented by the sum of the detected values of the polarized components with perpendicular direction, the detected values being represented by the pixel values at the identical position of the detected value images by the two layers.

Figure 11:
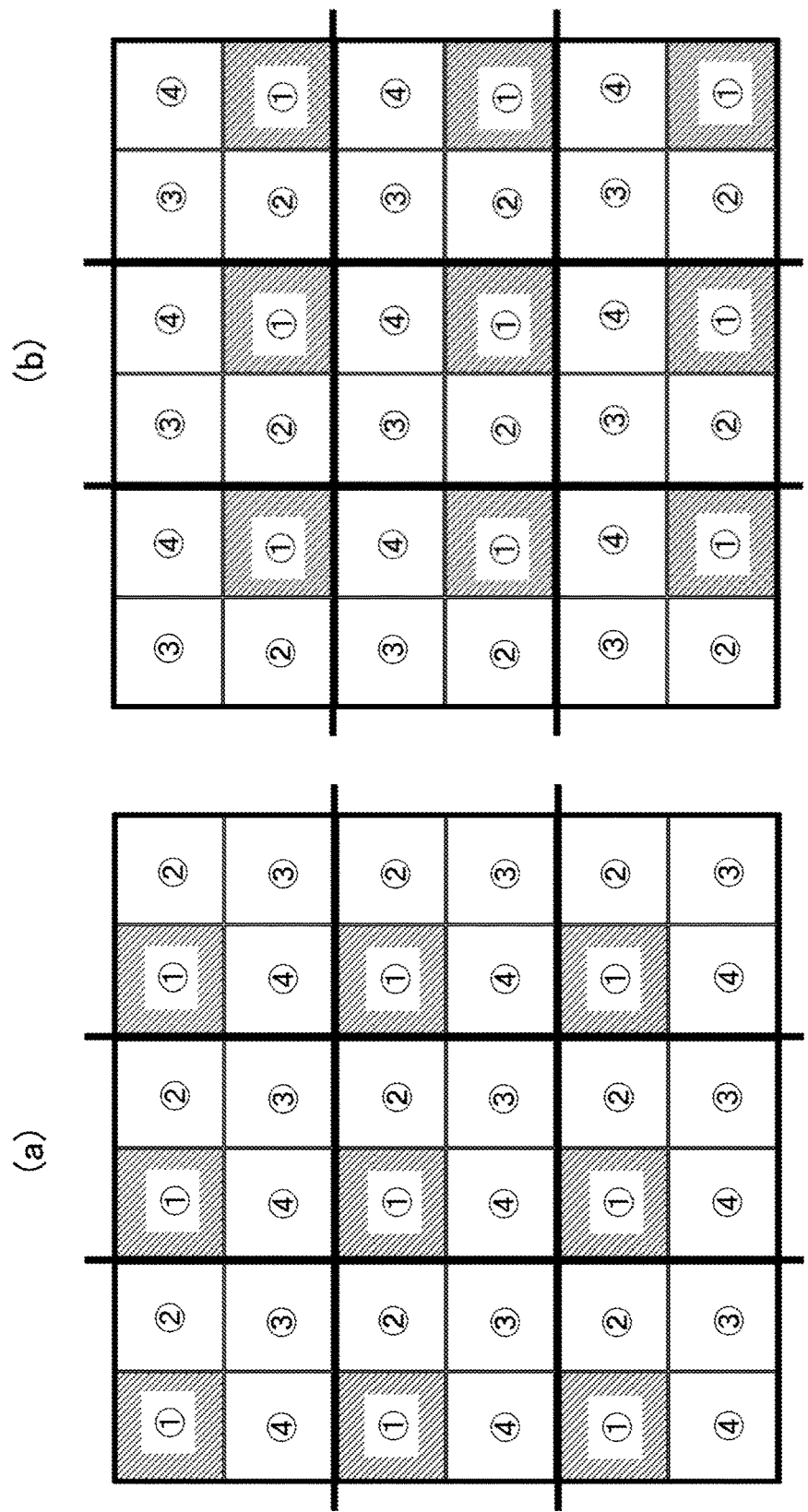
FIG. 11 is a diagram to explain a method of generating data of polarized image from a detected value image according to the embodiment.

On the other hand, the polarized image generating unit 92 generates the data of the polarized image for four directions on the basis of the detected value images by the first layer and the second layer. FIG. 11 is a diagram illustrating the method for generating the data of polarized image from the detected value image. Part (a) depicts the 6×6 pixel array of the first layer detected value images. Part (b) depicts the 6×6 pixel array of the second layer detected value images. The thick lines represent the boundary for the 2×2 pixel array which is the minimum unit to detect the polarized light in the four directions. Each pixel array has one pixel for each of the first to fourth directions indicated by the numeric characters. The pixels in the first direction, for example, are discretely arranged such that they surround the pixels in other directions, as depicted by hatching. This applies also to those images in other directions. Thus, the polarized image generating unit 92 performs interpolation on the pixel values and then produces the data of polarized images without gaps in every direction for the respective detected value images.

The interpolation is accomplished by any known method such as nearest neighbor interpolation, bilinear interpolation, and bicubic interpolation. However, the mere interpolation mentioned above makes pixels suffer from phase displacement which depends on the arrangement of films in the orientation axis within the 2×2 pixel array. To address this problem, the polarized image generating unit 92 adjusts the position of the pixel such that the pixels in the four directions in the 2×2 pixel array appear eventually at the same position in the polarized image in each direction. To be more concrete, the first layer detected value images have their pixel position adjusted as follows. The polarized images in the first direction are displaced as much as 0.5 pixel rightwards and downwards. The polarized images in the second direction are displaced as much as 0.5 pixel leftwards and downwards. The polarized images in the third direction are displaced as much as 0.5 pixel leftwards and upwards. The polarized images in the fourth direction are displaced as much as 0.5 pixel rightwards and upwards.

The foregoing procedure is also applied as follows to the second layer detected value images. That is, the polarized images in the third direction are displaced as much as 0.5 pixel rightwards and downwards. The polarized images in the fourth direction are displaced as much as 0.5 pixel leftwards and downwards. The polarized images in the first direction are displaced as much as 0.5 pixel leftwards and upwards. The polarized images in the second direction are displaced as much as 0.5 pixel rightwards and upwards. The polarized image generating unit 92 further sums up the polarized image generated from the first layer detected value image and the polarized image generated from the second layer detected value image. (This addition is performed on the images having the identical direction.) It eventually generates the polarized images in four directions.

The polarized image generating unit 92 also utilizes the luminance image which has been generated by the natural light image generating unit 90 as mentioned above, thereby causing the polarized image to express minute changes such as edge parts. To this end, the polarized image generating unit 92 extracts the high-frequency component hf_Y(x,y) from the luminance image in question by means of the high-pass filter. It processes the image containing the edge part such that the addition of hf_Y(x,y) to the pixel value is performed on the image to which the polarized image in all the directions for the two layers has been or has not yet been added. Incidentally, the edge part may be specified by using the result which has been obtained when the defect detecting unit 88 detected defects.

Figure 12:
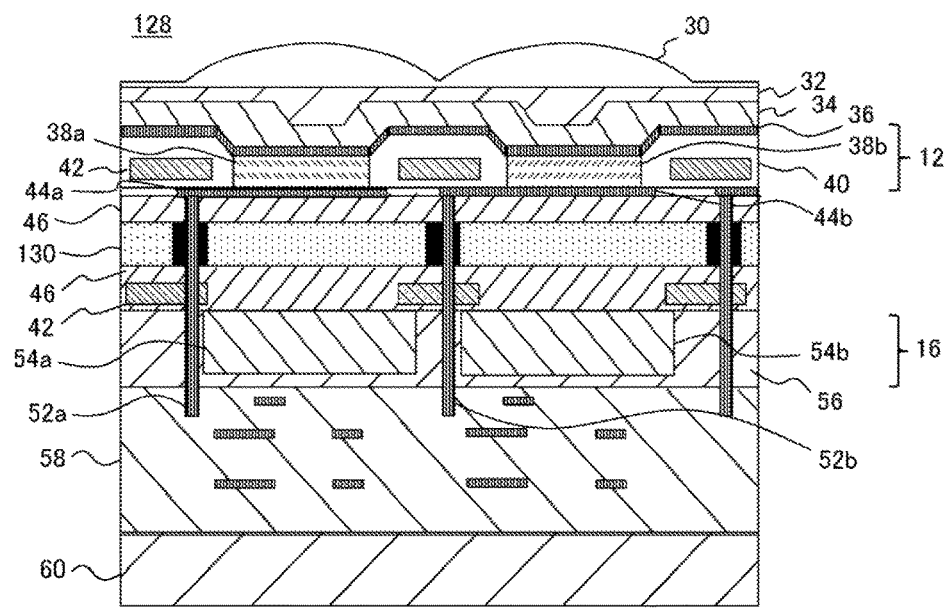
FIG. 12 is a sectional view depicting a structure of the imaging element in a case in which polarized components are acquired in terms of color information according to the embodiment.

The foregoing example is based on the procedure to acquire gray scale images; the same procedure as mentioned above may be used to acquire color information if color filters are added. The imaging element to acquire the polarized components in terms of color information is constructed as depicted in FIG. 12 which is a sectional view. FIG. 12 depicts the constituents which are given (without explanation) the same reference signs as in FIG. 4 depicting the imaging element 28. An imaging element 128 differs in structure from the imaging element 28 in that a color filter layer 130 is placed under the first light detecting layer 12 and above the second light detecting layer 16. Incidentally, between the color filter layer 130 and the first light detecting layer 12 is interposed the interlayer insulating film 46.

Because of the foregoing structure, the light reaching the second light detecting layer 16 passes through the first light detecting layer 12 and the color filter layer 130, so that it has the polarized components for specific colors and in specific direction. The light which has passed through the individual color filters is detected by the second light detecting layer 16, so that there is obtained polarized color information. The example depicted in FIG. 12 is equivalent to that depicted in FIG. 4 in that the pixels of the first image detecting layer 12 correspond to the pixels of the second image detecting layer 16 one by one; however, this does not always apply to the correspondence of individual pixel regions, as mentioned later.

Figure 13:
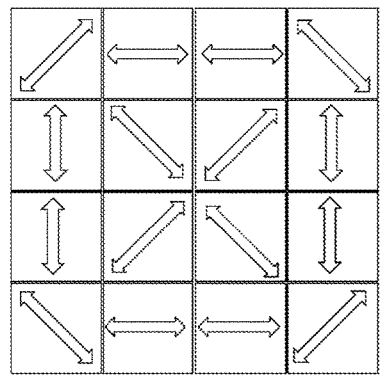
FIG. 13 is a diagram illustrating the relation between the pixel array of the first light detecting layer and the pixel array of the second light detecting layer in a mode in which color information is acquired in terms of a second layer detected value image according to the embodiment.
Figure 13:
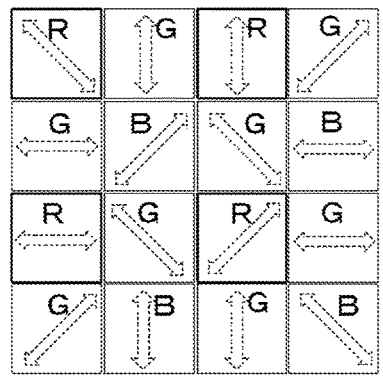

The mode of acquiring the color information in terms of the second layer detected value image is depicted in FIG. 13. The depicted mode indicates the relation between the pixel array of the first light detecting layer 12 and the pixel array of the second light detecting layer 16. Part (a) of FIG. 13 depicts the 4×4 pixel array of the first light detecting layer 12, and Part (b) of FIG. 13 depicts the 4×4 pixel array of the second light detecting layer 16 thereunder. In this example, there is a one-by-one correspondence between the pixels of the first light detecting layer 12 and the pixels of the second light detecting layer 16, as mentioned above. The pixel of the first light detecting layer 12 and the pixel of the second detecting layer 16 which are at the identical position detect the polarized components in the directions which are perpendicular to each other as indicated by the open arrows.

Figure 16:
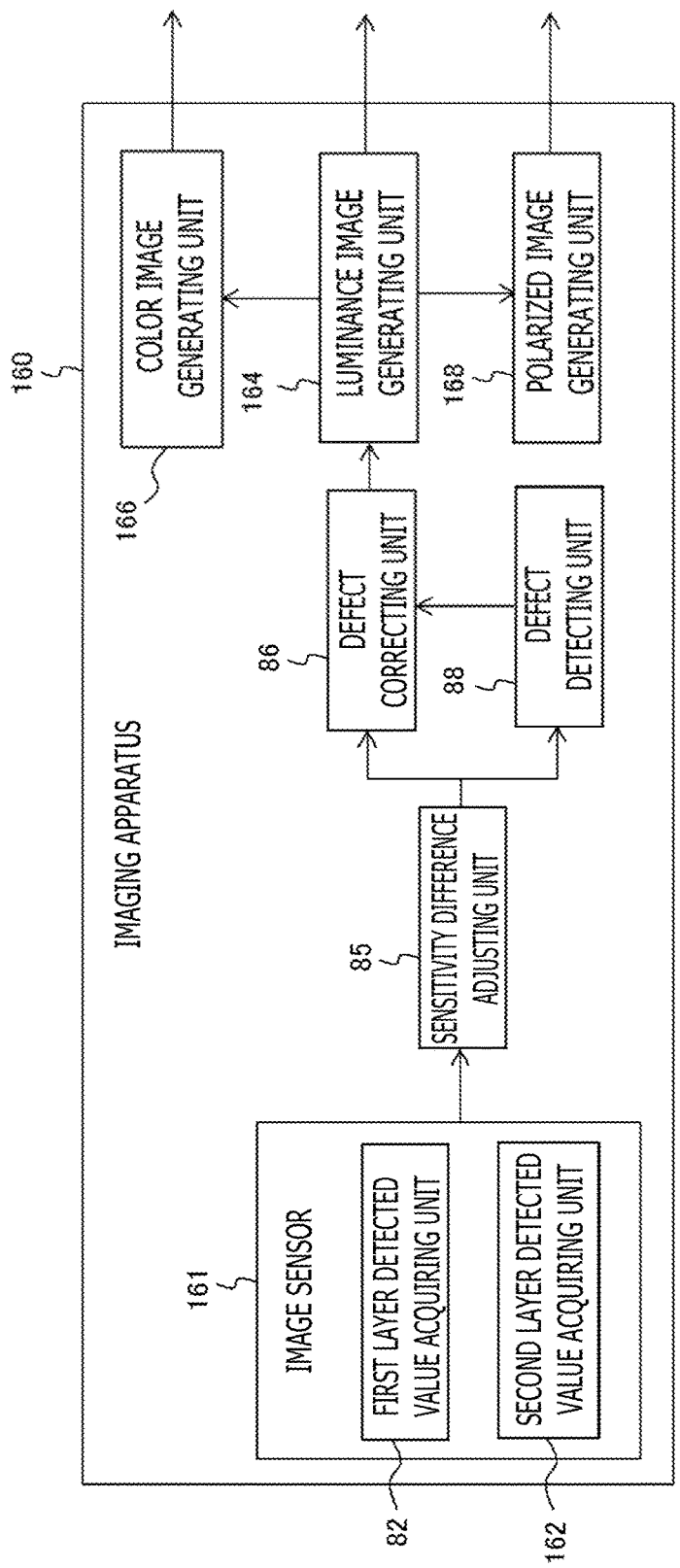
FIG. 16 is a block diagram depicting functions of an imaging apparatus including an image sensor that acquires polarized components in terms of color information according to the embodiment.

In the case where the color filter layer 130 has the Bayer array, each 2×2 pixel array in the pixel array of the second light detecting layer 16 depicted in Part (b) of FIG. 16 causes the upper left pixel to detect the polarized component of red (R), the upper right and lower left pixels to detect the polarized component of green (G), and the lower right pixel to detect the polarized component of blue (B). In this example depicted in Part (a), the direction of polarization in the first light detecting layer 12 is variously arranged for each 2×2 pixel array. This arrangement allows the 4×4 pixel array of the second light detecting layer 16 to detect all the polarized components in the four directions for all the colors (red, green, and blue). The foregoing is true also in the case where the first light detecting layer 12 has the direction of polarization arranged identically for all the 2×2 pixel units and the second light detecting layer 16 has the color arrangement varied for individual 2×2 pixel arrays.

Figure 14:
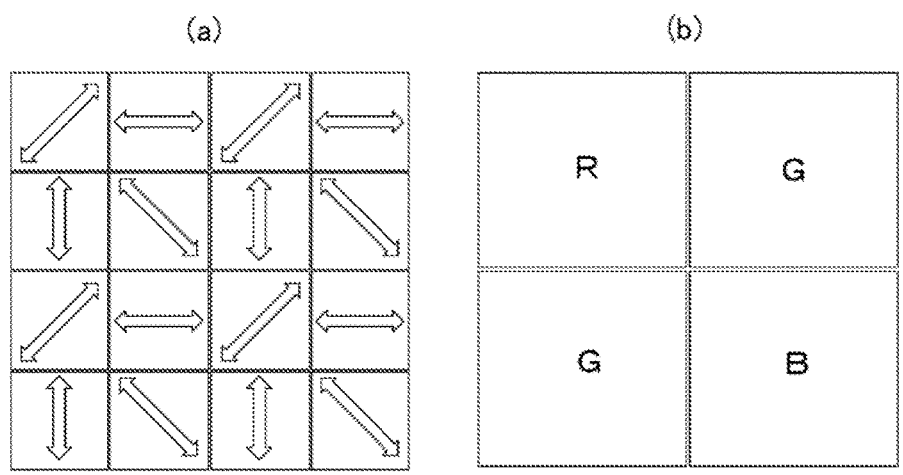
FIG. 14 is a diagram illustrating another example of the relation between the pixel array of the first light detecting layer and the pixel array of the second light detecting layer in the mode in which color information is acquired in terms of a second layer detected value image according to the embodiment.

The mode of acquiring the color information in terms of the second layer detected value image is depicted in FIG. 14. The depicted mode indicates another example of the relation between pixel arrays. Part (a) of FIG. 14 depicts the 4×4 pixel array of the first light detecting layer 12, and Part (b)

of FIG. 14 depicts the 2×2 pixel array of the second light detecting layer 16 thereunder. In this example, the 2×2 pixel array of the first light detecting layer 12 corresponds to one pixel of the second light detecting layer 16. That is to say, the remaining components of the polarized components in the four directions which have been absorbed by the first light detecting layer 12 are detected all together by one pixel of the second light detecting layer 16. As the result of the color filter 130 detecting the light of each color of the pixels in Bayer array in the second light detecting layer 16, each pixel of the second light detecting layer 16 represents the detected value which is the information of unpolarized red, green, and blue.

Figure 15:
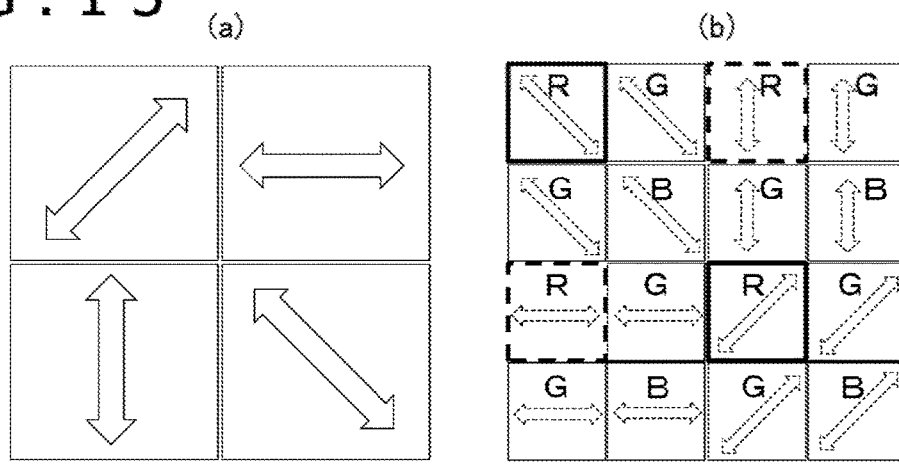
FIG. 15 is a diagram illustrating a further example of the relation between the pixel array of the first light detecting layer and the pixel array of the second light detecting layer in the mode in which color information is acquired in terms of a second layer detected value image according to the embodiment.

FIG. 15 depicts another example of the relation among the pixel arrays in the mode to acquire color information in terms of the second layer detected value image. Part (a) of FIG. 15 depicts the 2×2 pixel array of the first light detecting layer 12, and Part (b) of FIG. 15 depicts the 4×4 pixel array of the second light detecting layer thereunder. In other words, one pixel of the first light detecting layer 12 corresponds to the 2×2 pixel array of the second light detecting layer 16. That is to say, the component perpendicular to the polarizing component in one direction which has been absorbed by the first light detecting layer 12 is detected by the 2×2 pixel of the second light detecting layer 16. As the result of the color filter layer 130 detecting the light of each color of the pixels in Bayer array in the second light detecting layer 16, each pixel of the second light detecting layer 16 separates and detects each 2×2 pixel in the same direction with the waveband of red, green, and blue.

As depicted in FIGS. 13 to 15, the regions of one pixel of the first light detecting layer 12 and the second light detecting layer 16 may be variously combined according to the size and number of the lower electrode 44 and a photoelectric conversion element 54. In the case where the color information is to be acquired, the unit of pixel for each detecting layer may be determined appropriately from the standpoint of accuracy with which the necessary data is obtained and ease with which the element is produced (for example, ease with which the organic film has its orientation axis aligned), because the polarization information in the same direction for the same color tends to be discrete one on the image plane, as will be mentioned later.

The color information of polarized components which is acquired as mentioned above can be used to generate the color image of natural light. FIG. 16 is a block diagram depicting the functions of the imaging apparatus including the image sensor that acquires the polarized component as the color information. Incidentally, the imaging apparatus depicted in FIG. 16 has the same units in common with the imaging apparatus 100 depicted in FIG. 7; and such units are given same reference signs without explanation.

The imaging apparatus 160 includes an image sensor 161, a sensitivity difference adjusting unit 85, a defect detecting unit 88, a defect correcting unit 86, a luminance image generating unit 164 which generates luminance images of natural light, a color image generating unit 166 which generates color images of natural light, and a polarized image generating unit 168 which generates color images of polarized components. The image sensor 161 is identical in structure with the image sensor 70 depicted in FIG. 5 and functions in almost the same way as the image sensor 70 depicted in FIG. 7.

Note that, since the imaging element in this case includes the color filter layer 130 as depicted in FIG. 12, the detected values output from the second layer detected value acquiring unit 162 include color information of red, green, and blue.

To be concrete, in the case of the pixel region as depicted FIGS. 13 and 15, the detected value is the data of polarized components and it represents the combination of color information and direction of polarization. In the case of the pixel region as depicted in FIG. 14, the detected value is the data for unpolarized light and hence it represents only color information.

Incidentally, as compared with the imaging element 28 depicted in FIG. 4, the imaging element 128 depicted in FIG. 12, which is provided with the color filter layer 130, has a long distance between the first light detecting layer 12 and the multilayer wiring layer 58. This leads to a more restricted working speed than in the case of the second light detecting layer 16. In this example, therefore, the timing for the first layer detected value acquiring unit 82 to read out the data should preferably be controlled independently of the second layer detected value acquiring unit 162. To achieve this object, the second layer detected value acquiring unit 162 is set for high-speed reading and used also for display, and the first layer detected value acquiring unit 82 utilizes the data supplementarily at an output rate of approximately ½ or ⅓ of the output rate for the second layer detected value acquiring unit 162.

The sensitivity difference adjusting unit 85, the defect detecting unit 88, and the defect correcting unit 86 each have the same functions as the units explained above with reference to FIG. 7. The luminance image generating unit 164 functions in the same way as the natural light image generating unit 90 depicted in FIG. 7. That is, the luminance image generating unit 164 adds together the first layer detected value image and the second layer detected value image, both scale-adjusted, thereby generating a luminance image of natural light. In this case, however, the simple addition of pixel values would result in uneven luminance in the Bayer array because the second layer detected value image varies in color (waveband) to be detected from pixel to pixel. This problem is addressed by adding the pixel value in terms of binning image which is obtained by virtually treating four (2×2) pixels as one pixel. This procedure gives rise to even luminance information independent of the color to be detected. In other words, the luminance $Y_{1/4}(x,y)$ is obtained as follows assuming that the region corresponding to the region of four pixels of the second light detecting layer 16 constitutes one pixel.

$$Y_{1/4}(i,j)=Ocon_{ave}(i,j)+S_{1/4}(i,j)$$

In the above formula, (i,j) denotes the position coordinate for one pixel including 2×2 pixel units of the second layer detected value image whose position coordinate is defined by (x,y); $Ocon_{ave}(i,j)$ denotes the pixel value (scale-adjusted) of the first layer detected value image, which has been averaged by each region which is the same region as the 2×2 pixel of the second layer detected value image; and $S_{1/4}(i,j)$ denotes the pixel value S(x,y) of the second layer detected value image, which has been averaged by each 2×2 pixel. The value of $Ocon_{ave}(i,j)$ for the first layer detected value image is obtained by using the number of pixels which varies depending on the relation with the pixel region of the second layer detected value image. For example, in the case depicted in FIG. 13, the average value is obtained for each 2×2 pixel, and in the case depicted in FIG. 14, the average value is obtained for each 4×4 pixel. In the case depicted in FIG. 15, the original pixel value is used as such.

The luminance image generating unit 164 recovers the image with original resolution from the image with luminance $Y_{1/4}(i,j)$ which has been obtained as mentioned above. To be concrete, this process is accomplished as follows. The two-dimensional array of luminance $Y_{1/4}(i,j)$ is made to have four times as many pixels as original by interpolation, and the result is combined with the high-frequency components of the (scale-adjusted) first layer detected value image, so that the detail is restored. The luminance image generating unit 164 outputs at appropriate timing the thus generated luminance image to the memory apparatus and image processing apparatus connected to the imaging apparatus 160.

Figure 17:
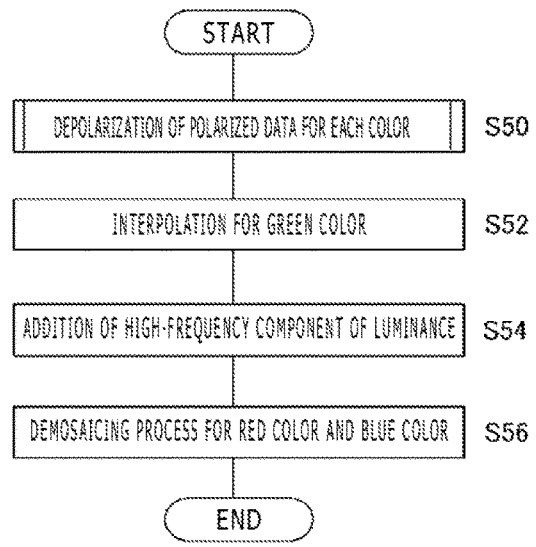
FIG. 17 is a flowchart depicting a procedure by which a color image generating unit generates a color image of natural light according to the embodiment.

The color image generating unit 166 generates the color image of natural light on the basis of the second layer detected value image. FIG. 17 is a flowchart depicting the procedure for the color image generating unit 166 to generate the color image of natural light. First, the color image generating unit 166 depolarizes the second layer detected value image for each color (S50). The term "depolarize" means to make the detected value of polarized component independent of the position that varies according to the direction of polarization. However, this process may be omitted in the case of pixel region as depicted in FIG. 14 where the detected value is unpolarized from the beginning.

Next, the color image generating unit 166 performs demosaicing to interpolate the pixel values for each color which are discretely represented in the Bayer array. First, the color image generating unit 166 performs interpolation on the values for green pixels existing in a larger number (S52). At this time, the high-frequency component of the luminance image, which has been generated by the luminance image generating unit 164, is added so that the detail of the image is restored (S54). The process for addition of the high-frequency component in S54 may be performed as part of the process for interpolation in S52 or may be performed individually after the process for interpolation. The resulting values of green pixels in all the pixels may be used for demosaicing of the red and blue pixels (S56).

This process may be carried out by the demosaicing method which is used for ordinary imaging apparatuses. The above-mentioned process gives rise to the natural light image of full color on the basis of the color information of the second layer detected value image. The color image generating unit 166 outputs at an appropriate timing the data of the thus generated image to the memory apparatus or image processing apparatus connected to the imaging apparatus 160. The image may be output to and displayed on any display apparatus such as television because it is equivalent to ordinary full-color images.

Figure 18:
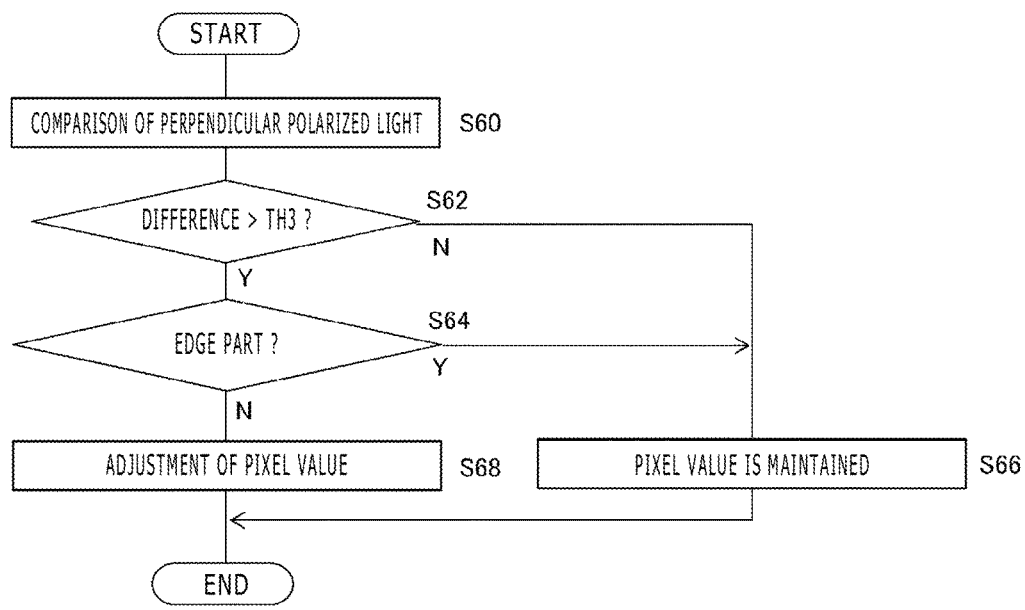
FIG. 18 is a flowchart depicting a procedure by which step S50 in FIG. 17 converts polarized data into unpolarized data.

FIG. 18 is a flowchart depicting the procedure to depolarize the polarized data in step S50 depicted in FIG. 17. The procedure according to this flowchart is applied to each unit including the 4×4 pixel array of the second light detecting layer 16 which is depicted in Part (b) of FIG. 13 and Part (b) of FIG. 15. The step for depolarization is carried out by comparing with each other the polarized components in the perpendicular directions. Comparison in this manner quantitatively produces the largest difference in pixel value. It is substituted by the averaged value on the assumption that the larger the difference, the larger the position dependence. The value of polarized component which has been detected for each color is compared with the value of the pixels having perpendicular direction (S60). For example, if the process is to be applied to the red pixels among the pixel array depicted in Part (b) of FIG. 15, calculation is performed to obtain the difference in value between two pixels surrounded by thick solid lines, and also to obtain the difference in value between two pixels surrounded by thick dashed lines.

However, the foregoing procedure is practiced by comparing in terms of average values in the case where there are more than one detected value for identical color in identical direction in the neighborhood. In the case of the pixel array depicted in Part (b) of FIG. 15, in which the green pixels in the same direction contain two pixels on the diagonal line of the 2×2 pixel array, the average of the two pixel values is used for comparison of green pixels. If the difference in value between two sets of pixels representing the polarized components perpendicular to each other for each of red, green, and blue is within a given threshold value Th3 (N of S62), it is assumed that the color of the pixel array does not depend on the position and the pixel value is left intact (S66). Even though the difference exceeds the threshold value Th3, the pixel value is left intact if the region in question contains the edge part (Y of S64, S66).

The foregoing is elucidated as follows. The edge part greatly varies in luminance as mentioned above and hence the large difference in polarized components may not necessarily result from the direction of polarization. When either of the differences exceeds the threshold value Th3 and the region in question does not contain the edge part (Y of S62, N of S64), it is assumed that the direction of polarization largely depends on the position and the pixel value is adjusted so as to cancel the difference (S68). To be concrete, the pixel values with a large difference are averaged. In the case where there are more than one pixel with the same direction and the same color in the neighborhood as in the case of green pixels mentioned above and they are compared in terms of average values, the average values in question are averaged.

In this case, the values of more than one pixel which have a large difference in the average values and which are contained in the nth direction and the (n+2)th direction, which are perpendicular to each other, are multiplied by the following adjusting coefficients kcr(n) and kcr(n+2).

$$kcr(n)=(Save(n)+Save(n+2))/Save(n)$$

$$kcr(n+2)=(Save(n)+Save(n+2))/Save(n+2)$$

Here, Save(n) and Save(n+2) denote respectively the average of the value of the pixels contained in the nth direction and the (n+2)th direction. The position dependence is checked and the optional adjustment is made as mentioned above for each color and region, so that the values detected from the polarized components of each color are depolarized. The color image generating unit 166 generates the data of full-color image which stores the thus obtained values of pixels for red, green, and blue in each channel, and then it outputs at an appropriate timing the result to the memory apparatus and image processing apparatus connected to the imaging apparatus 160.

Figures 19, 20:
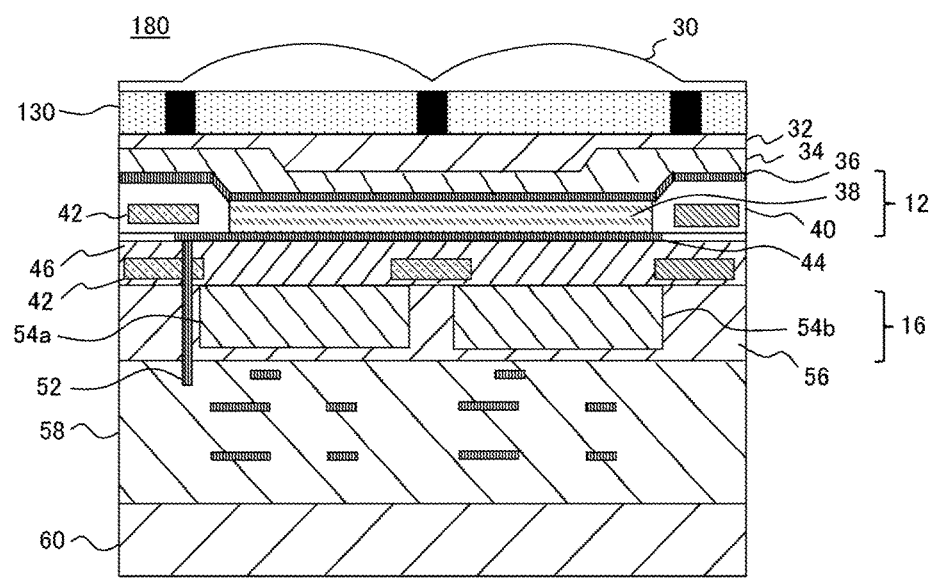
FIG. 19 is a diagram depicting part of a second layer detected value image in a case in which polarized components are acquired in terms of color information according to the embodiment.
FIG. 20 is a sectional view depicting another example of the structure of the imaging element in a case in which polarized components are acquired in terms of color information according to the embodiment.

The polarized image generating unit 168 generates the data of polarized color image in four directions on the basis of the detected values of the polarized components. However, in the case of pixel region as depicted in FIG. 14, in which the color information is unpolarized, the first layer detected value image or the image which has undergone adjustment is output, without change, as the gray scale polarized image. FIG. 19 depicts part of the second layer detected value image, in the case where the polarized components are obtained in terms of color information as in FIG. 13 or FIG. 15. In the case of mode depicted in FIG. 15, the polarized components in the same direction for each 2×2 pixel are depicted, and the polarized components in the four directions for each 4×4 pixel array are depicted. In FIG. 15, the thick solid lines indicate the boundary of the 4×4 pixel array in question. Incidentally, nearly the same procedure as mentioned above is applied to the procedure to generate the polarized image for the pixel array depicted in FIG. 13.

In the case where the polarized components are obtained in terms of color information, it is necessary for interpolation to extract the pixels with the same color in the same direction. The pixels in the first direction, which are depicted with hatching in FIG. 19, will be explained below as an example. There are two pixels for green (G) in the first direction in each 4×4 pixel array. By contrast, there is only one pixel for red (R) and blue (B) both in the first direction in each 4×4 pixel array. Therefore, their gap is larger than that of green. Thus, the values of green pixel in each direction are extracted for interpolation. The results are used for demosaicing to give the values of red and blue pixels. Interpolation for green may be accomplished by any known method such as nearest neighbor interpolation, bilinear interpolation, and bicubic interpolation.

The thus interpolated value of green pixel in each direction is made to represent minute changes in the edge part etc. by using the luminance image which has been generated by the luminance image generating unit 164. Thus, the polarized image generating unit 168 extracts the high-frequency components hf_Y(x,y) from the luminance image in question through the high-pass filter. The value hf_Y(x,y) is added to the value of green pixel for the pixel including the edge part. The thus obtained value of green pixel in each direction and the discrete detected value for red and blue polarized components are used to determine the values of red and blue pixels of polarized components in each direction.

This process will be appropriately applied to the ordinary demosaicing process. The values of pixels in each direction and for each color, which have been obtained as mentioned above, are arranged in such a way that the pixel has its phase displaced depending on the arrangement of films of respective orientation axes in the 4×4 pixel array or on the arrangement of colors in the region with the same direction. Consequently, adjustment is made for the position of pixel in such a way that the pixel of each color in each direction in the 4×4 pixel array expresses the image at the same position in the polarized image in the eventual direction. To be concrete, the pixel for red is displaced rightwards as much as 0.5 pixel and downwards as much as 0.5 pixel.

The pixel for blue is displaced leftwards as much as 0.5 pixel and upwards as much as 0.5 pixel. The pixel for green is displaced leftwards or rightwards as much as 0.5 pixel and downwards or upwards as much as 0.5 pixel because there are two pixels in the region of the same direction. The polarized image generating unit 168 generates the polarized color image in all the directions as mentioned above, and it outputs at an appropriate timing the result to the memory apparatus and image processing apparatus connected to the imaging apparatus 160.

The following is a description of another mode to obtain the polarized components in terms of color information. Incidentally, the imaging elements used in the mode mentioned later are applicable to the image sensor and imaging apparatus mentioned above, as such or with partial modification in its function, and hence their duplicated explanation is omitted, with stress being placed on different points. FIG. 20 is a sectional view depicting another example of the structure of the imaging element to acquire the polarized components in terms of color information. Incidentally, identical signs are given, without explanation, to the same constituents as in the imaging elements 28 and 128 depicted in FIGS. 4 and 12. The imaging element 180 is constructed such that the first light detecting layer 12 has thereabove the color filter layer 130 in the imaging element 128 depicted in FIG. 12.

Because of this structure, the distance from the first light detecting layer 12 to the multilayer wiring layer 58 is shorter than in the imaging element 128 depicted in FIG. 12; this leads to the reduction of time for charge reading. This mode is also able to acquire the polarization information in color as in the case of FIG. 12 because each color of the color filter layer 130 is made to correspond to each pixel of at least one of the first light detecting layer 12 and the second light detecting layer 16. On the other hand, it is also able to acquire the polarized components in gray scale if the pixel region is properly established. The example depicted FIG. 20 is constructed such that the filters for two colors, which are arranged side by side in cross section, are provided with the organic photoelectric conversion film 38 and the lower electrode 44 for the first light detecting layer 12.

The same structure as mentioned above exists in the depthwise direction. Thus, the four regions of the color filter layer 130 have one pixel of the first light detecting layer 12. If the four regions of the color filter layer 130 include filters for red, green, and blue in Bayer array, and the first light detecting layer 12 has the organic photoelectric conversion film 38 including the material which orients in one axis for each pixel and absorbs all waveband of visible lights, as mentioned above, then the first light detecting layer 12 detects the polarized components in terms of gray scale according to the orientation axis of the film.

Figure 21:
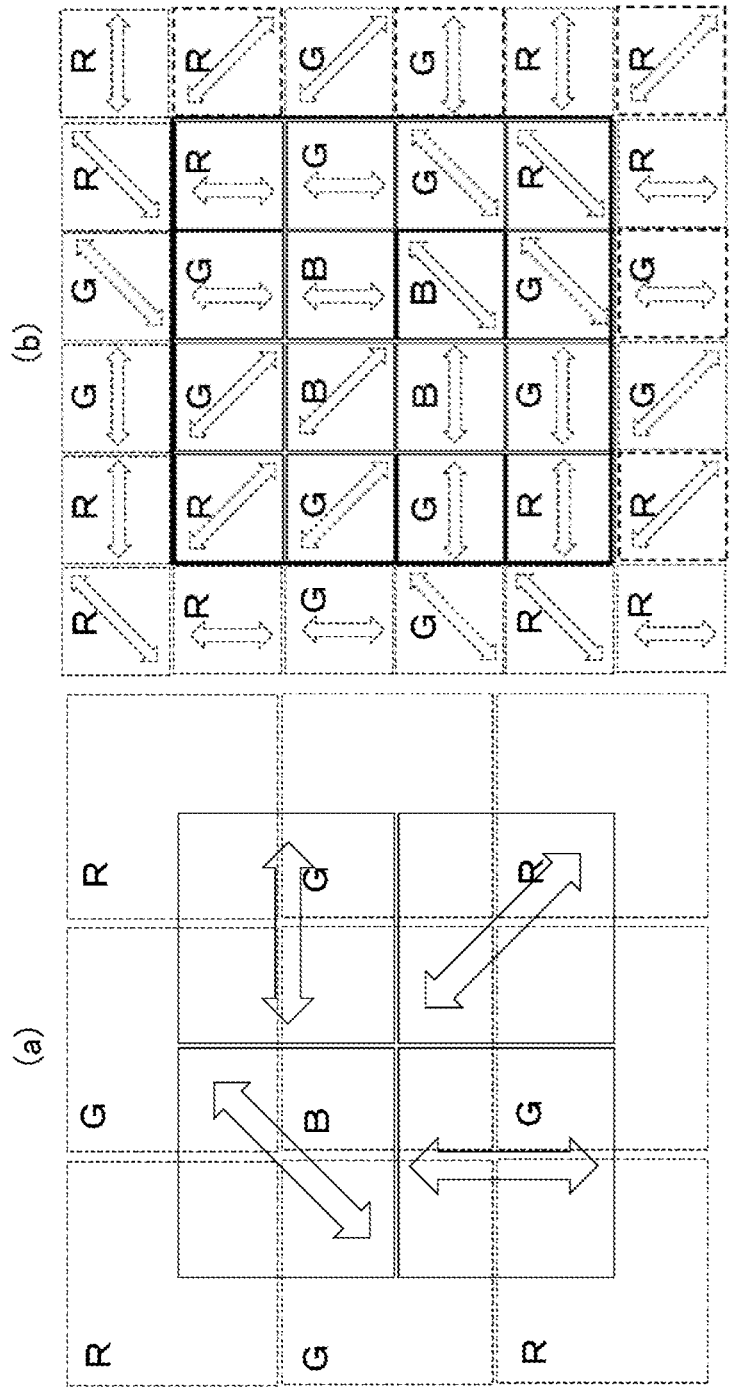
FIG. 21 is a diagram depicting another example of the relation between the pixel array of the first light detecting layer and the pixel array of the second light detecting layer according to the embodiment in a mode in which a color filter layer is arranged above the first light detecting layer.

This allows the same relation as depicted in FIG. 15 to hold between the pixel array of the first light detecting layer 12 and the pixel array of the second light detecting layer 16 and also gives rise to the same information. FIG. 21 depicts the mode in which the color filter layer 130 is arranged above the first light detecting layer 12. This mode exhibits differently the relation between the pixel array of the first light detecting layer 12 and the pixel array of the second light detecting layer 16. Part (a) of FIG. 21 depicts the 2×2 pixel array of the first light detecting layer 12, and Part (b) of FIG. 21 depicts the 4×4 pixel array (within thick lines) of the second light detecting layer 16, which is under the first light detecting layer 12, and their surrounding pixel array.

Part (a) of FIG. 21 depicts with dotted line squares the color filters for different colors. Each of these color filters has the same size as the pixel of the first light detecting layer 12 and are arranged (displaced) such that the center of each color filter coincides with the four vertices of the pixel. This configuration produces the following effect. The 4×4 pixel array in the thick line frame of the second light detecting layer 16, which is depicted in Part (b), allows all of the central 2×2 pixel array to exhibit polarized components of blue color, so that the four pixels represent all the polarized components in the four directions. The same takes place in other regions. That is, the polarized components of each color in the four directions can be obtained from the 2×2 pixels as constituent units. This means that the polarization information in more than one direction for the same color can be obtained at approximately the same position. In this way it is possible to eliminate errors attributable to the direction dependency which becomes larger than actual as the detection position becomes farther.

Figure 22:
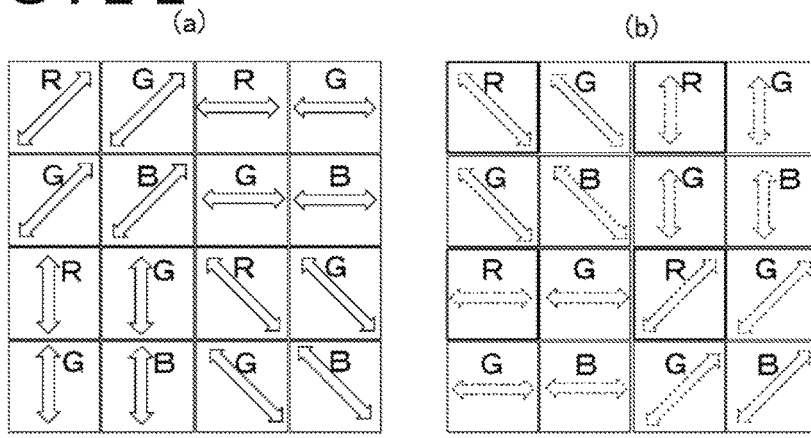
FIG. 22 is a diagram depicting another example of the relation between the pixel array of the first light detecting layer and the pixel array of the second light detecting layer according to the embodiment in a mode in which the color filter layer is arranged above the first light detecting layer.

FIG. 22 depicts the mode in which the color filter layer 130 is arranged above the first light detecting layer 12; this mode differs the from foregoing one in the relation between the pixel array of the first light detecting layer 12 and the pixel array of the second light detecting layer 16. Part (a) of FIG. 22 depicts the 4×4 pixel array of the first light detecting layer 12, and Part (b) of FIG. 22 depicts the 4×4 pixel array of the second light detecting layer 16 thereunder. This example is characterized in that the pixel region corresponds to the region of color filter for each color also in the first light detecting layer 12. In other words, the pixels in the first light detecting layer 12 and the pixels in the second light detecting layer 16 entirely correspond with the respective colors of the color filter one by one.

In this case, the pixels corresponding with each other of the first layer detected value image in the first light detecting layer 12 and the second layer detected value image in the second light detecting layer 16 represent the polarized components of the same color in the perpendicular directions and consequently their addition gives rise to the data of natural light. Thus, the image obtained after addition undergoes demosaicing in the usual way, so that there is obtained a full-color image of natural light. To generate the polarized color image in each direction, the first layer detected value image and the second layer detected value image undergo interpolation as explained above with reference to FIG. 19 to generate the respective polarized color images and they are summed up such that the polarized images in the same direction face each other. In this case, the resulting image contains the polarization information for the two layers and hence it functions as the polarized color image with a level closer to that of the original incident light.

Figure 23:
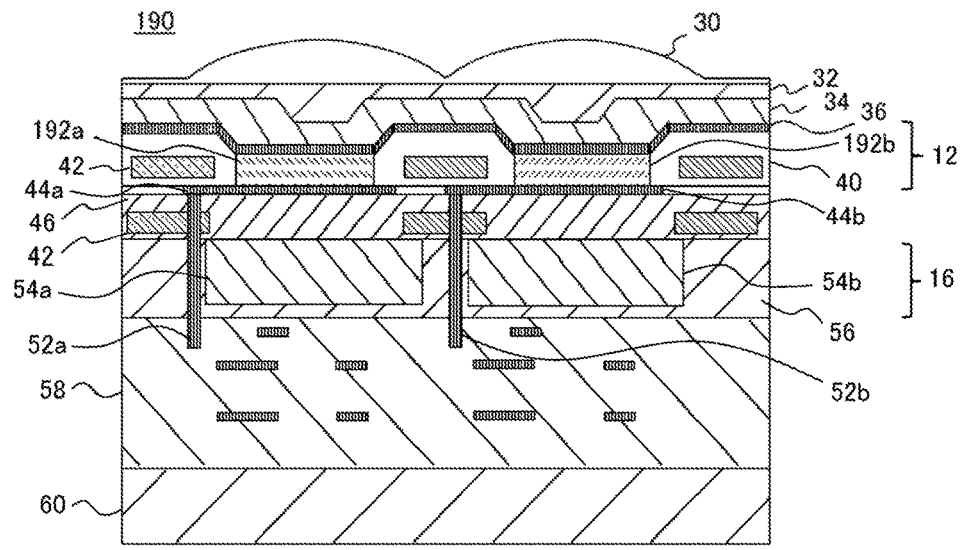
FIG. 23 is a sectional view depicting an example of the structure of the imaging element in a case in which polarized components are acquired in terms of color information by means of an organic photoelectric conversion film according to the embodiment.

The color information may be acquired, instead of by employing the color filter layer 130, by replacing the organic photoelectric conversion film of the first light detecting layer 12 with any material that selectively absorbs only the light of specific waveband. FIG. 23 is a sectional view depicting the structure of the imaging element that acquires the polarized components in terms of color information by means of the organic photoelectric conversion film. Incidentally, identical signs are given, without explanation, to the same constituents as in the imaging element 28 depicted in FIG. 4. An imaging element 190 differs from the imaging element 28 depicted in FIG. 4 in that the organic photoelectric conversion film of the first light detecting layer 12 includes a material that selectively absorbs the waveband of any one of red, green, and blue (organic photoelectric conversion film 192a and 192b).

Assuming that, for example, the organic photoelectric conversion films 192a and 192b have the Bayer array for the colors to be absorbed and the orientation axis is varied according to the specific array, each pixel of the first light detecting layer 12 represents the polarized color components. Moreover, assuming that the light passing them is detected by the second light detecting layer 16, each pixel of the second light detecting layer 16 represents the polarized components which are identical in color and perpendicular to the polarized color components detected by the first light detecting layer 12 and also represents the unpolarized components of the waveband other than that color.

Figure 24:
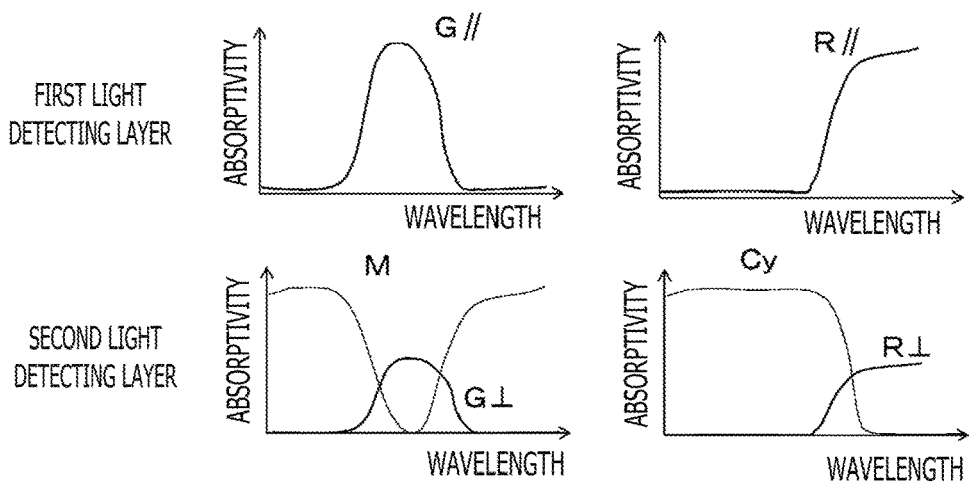
FIG. 24 is a diagram to explain light to be absorbed by the first light detecting layer and the second light detecting layer in the imaging element constructed as depicted in FIG. 23.

FIG. 24 is a graphical diagram that explains the light to be absorbed by the first light detecting layer 12 and the second light detecting layer 16 in the imaging element constructed as depicted in FIG. 23. The upper and lower parts of FIG. 24 depict respectively the relation between the wavelength and absorptivity of the light that is absorbed by the pixel of the first light detecting layer 12 and the corresponding pixel of the second light detecting layer 16. As depicted in the left side of FIG. 24, if one pixel of the first light detecting layer 12 absorbs the polarized component (G∥) of green, the green polarized component (G⊥) in the direction perpendicular to it passes through and the unpolarized light of magenta (M) excluding the green waveband from the visible light waveband also passes through, and therefore they are absorbed and detected by the corresponding pixels of the second light detecting layer 16.

The right part of FIG. 24 depicts a situation in which one pixel of the first light detecting layer 12 absorbs the polarized component (R∥) of red. In this case, what passes through is the polarized component (R⊥) of red in the perpendicular direction and the unpolarized light of cyan (Cy) excluding the red waveband among the visible light wavebands. Consequently, they are absorbed and detected by the corresponding pixels of the second light detecting layer 16. Incidentally, also in the case where the polarized component of blue is absorbed by the first light detecting layer 12, similarly, the corresponding pixel of the second light detecting layer 16 has the polarized component of blue perpendicular to it and the unpolarized light of yellow absorbed and detected.

The structure mentioned above works as follows. The first layer detected value image of the first light detecting layer 12 becomes equivalent to the second layer detected value image of the second light detecting layer 16 in the case where the color filter layer 130 depicted in FIG. 12 or the like is provided. Thus, upon appropriate interpolation and demosaicing, it gives rise to polarized color images in all the directions. Also, if the first layer detected value images which has undergone scale adjustment are combined with the second layer detected value images of the second light detecting layer 16 in such a way that the corresponding pixels are added together, the waveband and the polarized component become into one, thereby giving rise to the gray scale luminance image of natural light. In this way it is possible to obtain a highly sensitive luminance image which has a less light loss than in the case where the color filter is employed.

Figure 25:
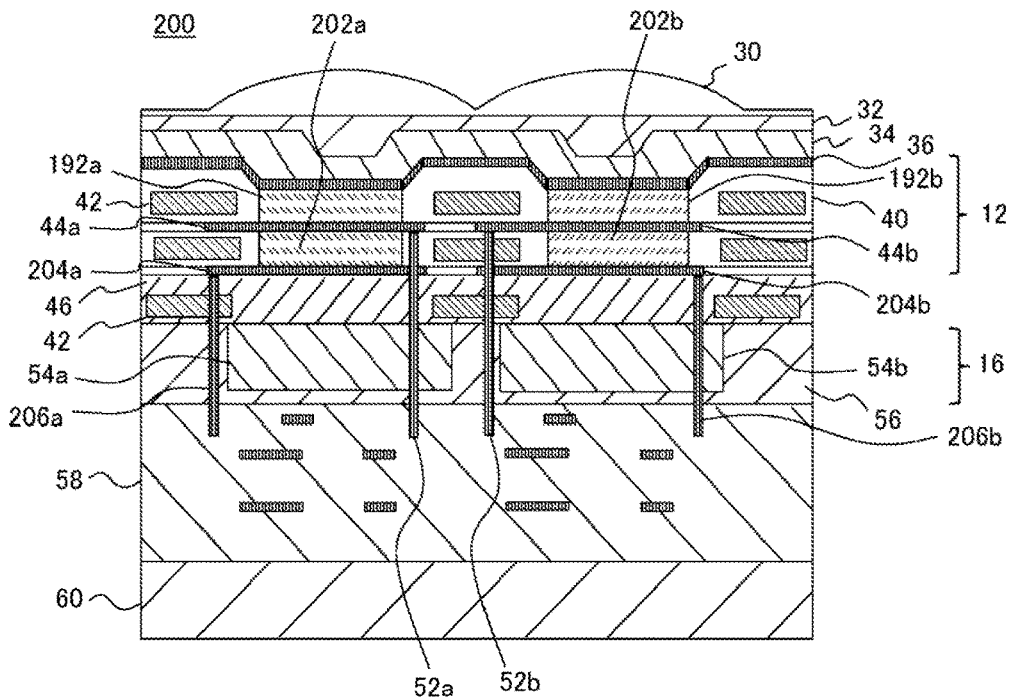
FIG. 25 is a sectional view depicting another example of the structure of the imaging element in a case in which polarized components are acquired in terms of color information by means of an organic photoelectric conversion film according to the embodiment.

FIG. 25 is a sectional view depicting another example of the structure of the imaging element to acquire the polarized component in terms of color information by means of the organic photoelectric conversion film. The imaging element depicted in FIG. 25 has the same constituents as those in the imaging element depicted in FIG. 23, and they are given the identical signs without explanation. The imaging element 200 differs from the imaging element 190 depicted in FIG. 23 in that the first light detecting layer 12 is replaced by that of double-layer structure. To be concrete, as with the case of FIG. 23, it includes an upper layer and a lower layer. The upper layer is the organic photoelectric conversion films 192a and 192b including the material which selectively absorbs the waveband of any one of red, green, and blue and which is oriented in a prescribed direction. The lower layer is the organic photoelectric conversion films 202a and 202b including the material which selectively absorbs the waveband of the same color as the organic photoelectric conversion films 192a and 192b and which is not oriented.

The lower organic photoelectric conversion films 202a and 202b utilize, as its upper electrodes, lower electrodes of the upper organic photoelectric conversion films 192a and 192b, and the lower organic photoelectric conversion films 202a and 202b are provided with lower electrodes 204a and 204b for reading out the charges resulting from photoelectric conversion and conductive plugs 206a and 206b. In the case where one electrode is shared between the lower electrode of the upper layer and the upper electrode of the lower layer as mentioned above, the upper layer and the lower layer read charges (electrons and holes) which are opposite to each other; the charges are made into pixel values by appropriate conversion.

Figure 26:
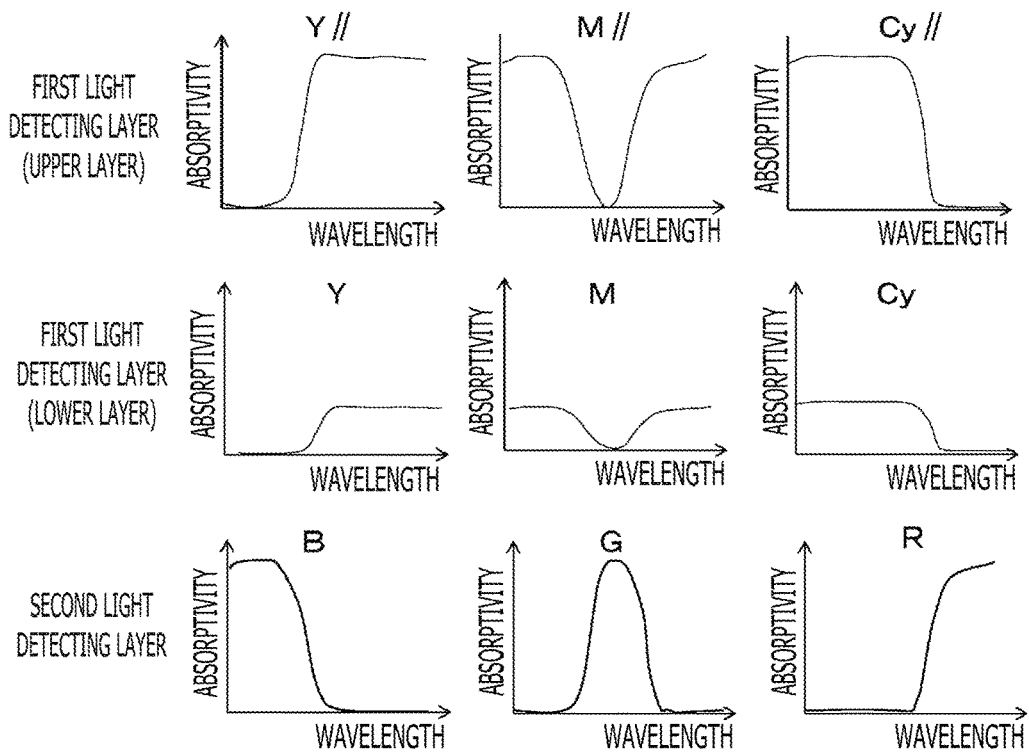
FIG. 26 is a diagram to explain light to be absorbed by the first light detecting layer and the second light detecting layer in the imaging element constructed as depicted in FIG. 25.

The foregoing structure permits the first light detecting layer 12 to absorb also the component perpendicular to the polarized component of specific color which is absorbed by the upper layer, and consequently the light to be detected by the second light detecting layer 16 becomes only the unpolarized components of other colors. FIG. 26 is a diagram to explain the light to be absorbed by the first light detecting layer 12 and the second light detecting layer 16 in the imaging element having the structure depicted in FIG. 25. The upper and middle parts of FIG. 26 depict the relation between the wavelength and absorptivity of the light absorbed by the pixels in the upper and lower layers of the first light detecting layer 12, and the lower part of FIG. 26 depicts the relation between the wavelength and absorptivity of the light absorbed by the corresponding pixels in the second light detecting layer 16.

As depicted in the left side of FIG. 26, one pixel in the upper layer of the first light detecting layer 12 absorbs the polarized component (Y∥) of yellow and the corresponding pixel in the lower layer absorbs the remaining components of yellow, in which case the unpolarized light of blue (B) in visible light excluding the waveband of the yellow passes through. This light is absorbed and detected by the corresponding pixel in the second light detecting layer 16. Incidentally, the lower layer of the first light detecting layer 12 absorbs and detects the light which is typically the polarized component perpendicular to the polarized component absorbed by the upper layer. However, this may be modified such that the lower layer detects the almost unpolarized light of yellow if the absorptivity is controlled according to the film thickness of the upper organic photoelectric conversion film 192a to permit also the polarized component to be absorbed to pass through in a certain ratio.

In the case (as depicted in the center of FIG. 26) where one pixel in the upper layer of the first light detecting layer 12 absorbs the polarized component (M∥) of magenta and the corresponding pixel in the lower layer absorbs the remaining components of magenta, the unpolarized light of green (G) in visible light excluding the waveband of the magenta passes through and hence it is absorbed and detected by the corresponding pixel of the second light detecting layer 16. Moreover, in the case depicted in the right side of FIG. 26 where one pixel in the upper layer of the first light detecting layer 12 absorbs the polarized component (Cy∥) of cyan and the corresponding pixel in the lower layer absorbs the remaining components of cyan, the unpolarized light of red (R) in visible light excluding the waveband of the cyan passes through and hence it is absorbed and detected by the corresponding pixel of the second light detecting layer 16.

The foregoing structure permits the second light detecting layer 16, which is the lowermost layer, to obtain the information of unpolarized light of blue, green, and red separately, and such information, after demosaicing, can be used as the full-color image of natural light for display. Also, the detected value image of the upper layer of the first light detecting layer 12 may undergo appropriate interpolation and demosaicing in the same way as in the case depicted in FIG. 24 so that the polarized color images in all directions can be obtained. In addition, the corresponding pixels of the detected value images of the upper layer and lower layer of the first light detecting layer 12 may be summed up so as to obtain the unpolarized components of each color, and the unpolarized components can be used to generate the unpolarized color images.

Moreover, the sum of the detected value images of the upper layer and lower layer of the first light detecting layer 12 may be added to the detected value image of unpolarized light of each color of the second light detecting layer 16, so that the waveband is made into one and there is obtained the luminance image of natural light. The foregoing procedure also gives rise to a high-sensitivity image suffering less light loss than in the case where the color filter is employed.

Figure 27:
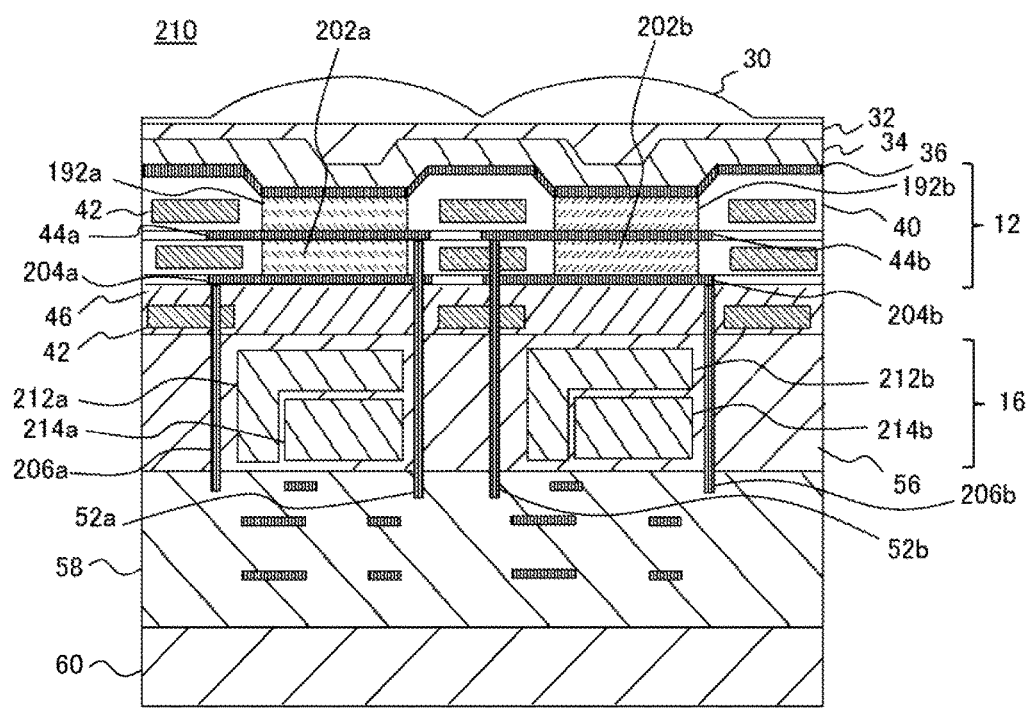
FIG. 27 is a sectional view depicting another example of the structure of the imaging element in a case in which polarized components are acquired in terms of color information by means of an organic photoelectric conversion film according to the embodiment.

FIG. 27 is a sectional view depicting another example of the structure of the imaging element which acquires the polarized component in terms of color information by means of the organic photoelectric conversion film. The imaging element depicted in FIG. 27 has the same constituents as those in the imaging element depicted in FIG. 25, and they are given the identical signs without explanation. The imaging element 210 differs from the imaging element 200 depicted in FIG. 25 in that the second light detecting layer 16 is replaced by the inorganic photoelectric conversion layer that performs photoelectric conversion selectively on light of specific colors. To be concrete, it differs from the foregoing imaging element in that the photoelectric conversion elements 54a and 54b, which performs photoelectric conversion on the light that has passed through the first light detecting layer 12, are replaced by inorganic photoelectric conversion layers 212a and 212b, which detect blue color components in the light which has passed through, and also by inorganic photoelectric conversion layers 214a and 214b, which detect red color components, the inorganic photoelectric conversion layers 212a and 212b and the inorganic photoelectric conversion layers 214a and 214b being arranged on top of each other.

The inorganic photoelectric conversion layers 212a, 212b, 214a, and 214b are photodiodes having the p-n junction; they absorb entirely or partly the waveband of blue color or red color and convert the absorbed light into charges to be stored therein. In other words, the photoelectric conversion layer separates for detection the color components of light in the vertical direction of the element, and this technique is known as disclosed in JP 2013-183056A, for example. On the other hand, the imaging element 210 has the first light detecting layer 12 which includes as the upper layer the organic photoelectric conversion films 192a and 192b and as the lower layer the organic photoelectric conversion films 202a and 202b, and they include an organic material that selectively absorbs green color for photoelectric conversion.

As in the case explained above with reference to FIG. 25, the upper layer of the first light detecting layer 12 is a film oriented in a specific axial direction, so that the oriented film detects the polarized component, and the lower layer is a non-oriented film. This arrangement permits the first light detecting layer 12 to absorb the waveband of green color. The effect is that the upper layer of the first light detecting layer 12 gives the polarized image of green color, summing up the detected values of the upper and lower layers of the first light detecting layer 12 gives the unpolarized image of green color, and the second light detecting layer 16 gives the unpolarized images of blue and red.

In this case, as far as the polarized components in each direction are concerned, the detected values are obtained discretely according to the arrangement of the films differing in the orientation axis in the same way as described above; however, as far as the color component of green, blue, and red are concerned, the detected values are obtained from the start for all the pixels. Therefore, it is only necessary to perform interpolation when the polarized image is generated, which obviates the necessity for demosaicing for the unpolarized color image. Moreover, restricting the polarization information to one color is compensated by the fact that the interpolation may be performed with a small interval compared with the case in which the polarization information for three colors is to be obtained, and this leads to smaller errors.

Figure 28:
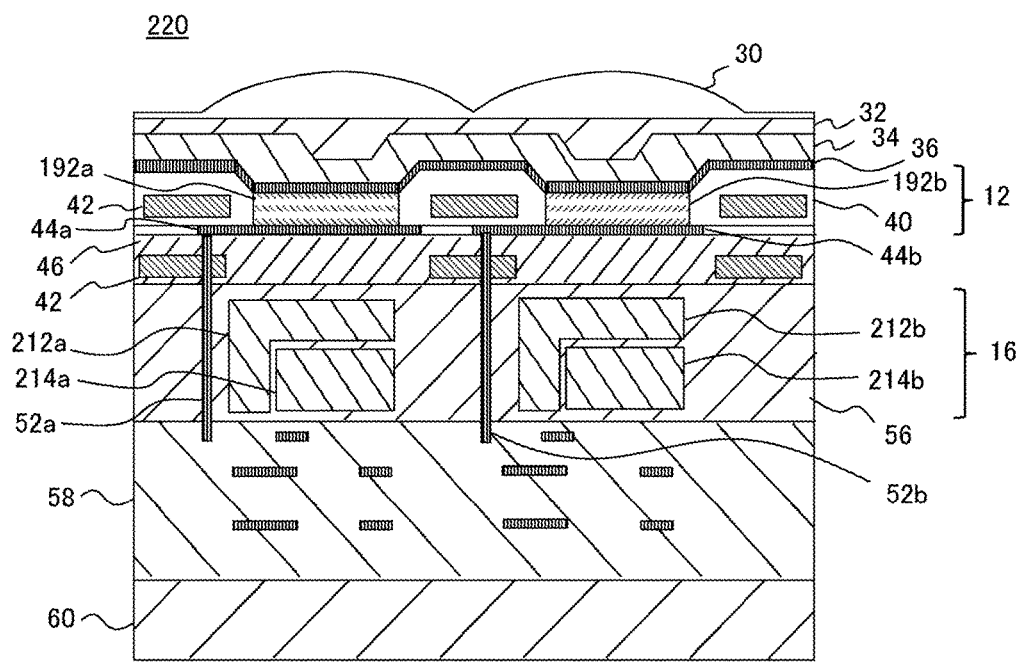
FIG. 28 is a sectional view depicting another example of the structure of the imaging element in a case in which polarized components are acquired in terms of color information by means of an organic photoelectric conversion film according to the embodiment.

FIG. 28 is a sectional view depicting another example of the structure of the imaging element which acquires the polarized component in terms of color information by means of the organic photoelectric conversion film. The imaging element depicted in FIG. 28 has the same constituents as those in the imaging element depicted in FIG. 27, and they are given the identical signs without explanation. The imaging element 220 differs from the imaging element 210 depicted in FIG. 27 in that the first light detecting layer 12 has its two layers of organic photoelectric conversion film replaced by only one layer of the organic photoelectric conversion films 192a and 192b for the upper layer. The first light detecting layer 12 is constructed in the same way as the first light detecting layer 12 of the imaging element 190 explained with reference to FIG. 23, except that the imaging element 220 depicted in FIG. 28 use an oriented film that selectively absorbs green color as the organic photoelectric conversion films 192a and 192b of the first light detecting layer 12.

Consequently, as depicted in the left side of FIG. 24, when the first light detecting layer 12 absorbs the green polarized component, other components reach the second light detecting layer 16. Other components include the green polarized component in the direction perpendicular to the green polarized component and the unpolarized light of magenta excluding the green waveband from the visible light waveband. As in the case depicted in FIG. 27, the inorganic photoelectric conversion layers 212a, 212b, 214a, and 214b of the second light detecting layer 16 separate for detection the magenta light in the vertical direction of the element into the components of blue color and red color. The procedure in this way is liable to cause errors in the result of detection of blue color because the incident light to the inorganic photoelectric conversion layers 212a and 212b of the upper layer contains the polarized component of green color which has passed through the first light detecting layer 12.

Figure 29:
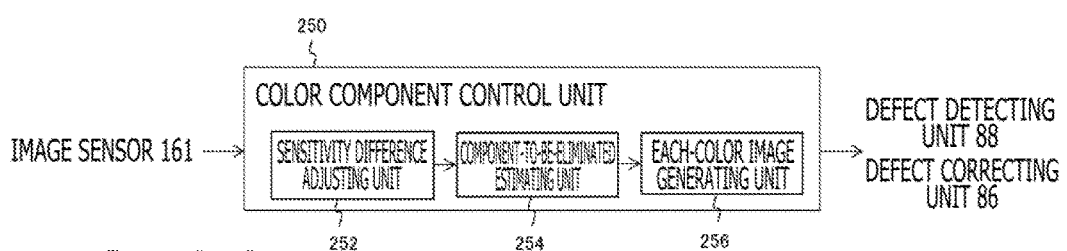
FIG. 29 is a block diagram depicting functions of a color component control unit according to the embodiment.

To cope with this situation, the imaging apparatus provided with the imaging element 210 is modified such that the imaging apparatus 160 depicted in FIG. 16 has its sensitivity difference adjusting unit 85 replaced by a color component control unit so that the detected value image of the inorganic photoelectric conversion layers 212a and 212b for blue color has the information of polarized component of green removed. FIG. 29 is a block diagram depicting the function of the color component control unit. The color component control unit 250 includes a sensitivity difference adjusting unit 252, a component-to-be-eliminated estimating unit 254, and an each-color image generating unit 256. The sensitivity difference adjusting unit 252 checks the first light detecting layer 12 for the sensitivity of detecting green color and also checks the inorganic photoelectric conversion layers 212a and 212b of the second light detecting layer 16 for the sensitivity of detecting green color and aligns the scale of green component of the detected value image of both according to the difference in sensitivity detected.

To be concrete, a detected value Og(x,y) of the first light detecting layer 12 is multiplied by a coefficient kg(x,y), and a converted value Og_con(x,y) with the scale adjusted to the sensitivity of the inorganic photoelectric conversion layers 212a and 212b of the second light detecting layer 16 is calculated as follows.

$$Og\_con(x,y) = kg(x,y) \times Og(x,y)$$

Here, (x,y) denotes the coordinate of the pixel in two-dimensional array, and the coefficient kg(x,y) is defined as follows according to initial calibration or calibration prior to operation of the imaging apparatus.

The first step is to photograph an object with a uniform gray surface that occupies the entire visual field, with the object being uniformly illuminated with light from an unpolarized green light source. In this case, the incident light only includes green components and, consequently, the inorganic photoelectric conversion layers 212a and 212b of the second light detecting layer 16 detect only the polarized component of green that has passed through the first light detecting layer 12. Therefore, the coefficient kg(x,y) is determined in such a way that the converted value of the detected value of the first light detecting layer 12 coincides with the detected value of the inorganic photoelectric conversion layers 212a and 212b for blue color of the second light detecting layer 16.

In other words, if the first light detecting layer 12 gives the detected value Og_in(x,y) and the inorganic photoelectric conversion layers 212a and 212b for blue of the second light detecting layer 16 give the detected value Sb_in(x,y), the value of kg(x,y) is calculated so that the following formula is satisfied.

$$Sb\_in = kg(x,y) \times Og\_in(x,y)$$

Here, the coefficient kg(x,y), if within a specific range in the entire images, may be a constant kg which does not depend on the position coordinate of the pixel. For example, the constant k may be determined by dividing $\Sigma Sb\_in(x,y)$ by $\Sigma Og\_in(x,y)$, with the former denoting the sum of the pixel value of the entire images due to the inorganic photoelectric conversion layers 212a and 212b for blue, and the latter denoting the sum of the pixel value of the entire images due to the first light detecting layer 12.

The sensitivity difference adjusting unit 252 multiplies each pixel of the detected value image of the polarized component of green, which has been output from the first light detecting layer 12, by the coefficient kg which has been established as mentioned above, thereby adjusting its scale, and then outputs the result to the component-to-be-eliminated estimating unit 254, together with the data of detected value image for blue and red colors which has been output from the second light detecting layer 16. The component-to-be-eliminated estimating unit 254 removes the green polarized component from the blue detected value image. At this time, the polarized component contained in the detected value image for blue color has its direction made dependent on the position in response to the arrangement of film in each orientation axis of the organic photoelectric conversion film 192 in the first light detecting layer 12.

Here, the component-to-be-eliminated estimating unit 254 utilizes the adjusted data of the detected value image of the first light detecting layer 12 in order to estimate at each position the value of polarized component to be eliminated from the detected value image for blue color. The each-color image generating unit 256 subtracts the estimated value of polarized component for green color from each pixel value of the detected value image for blue color, thereby completing the detected value image for all the colors including blue color. As the result, there are obtained the data for the polarized image of green color with its scale adjusted to the sensitivity of the second light detecting layer 16, the data for the polarized image of green color having the perpendicular direction in the corresponding pixel, the data for the unpolarized image of blue color, and the data for the unpolarized image of red color. The color component control unit 250 outputs the foregoing data to the defect detecting unit 88 and the defect correcting unit 86, thereby performing defect correction and generating images for subsequent output.

Figure 30:
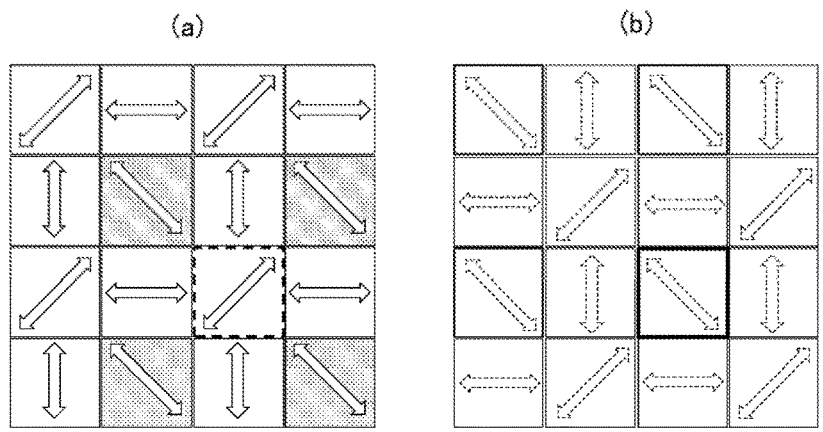
FIG. 30 is a diagram to explain a method by which a component-to-be-eliminated estimating unit estimates a value of a polarized component of green color to be eliminated from a detected value image of blue color according to the embodiment.

FIG. 30 is a diagram to explain the method by which the component-to-be-eliminated estimating unit 254 estimates the value of polarized component for green color to be eliminated from the detected value image for blue color. Part (a) of FIG. 30 depicts the 4×4 pixel array of the first light detecting layer 12, and Part (b) depicts the 4×4 pixel array of the inorganic photoelectric conversion layers 212*a* and 212*b* of the second light detecting layer 16 which is under the first light detecting layer 12. The former absorbs and detects the polarized component of green color in the direction indicated by the solid line arrows in Part (a). As the result, the pixel value of the latter includes the polarized component of green color in the direction indicated by the dotted line arrows in Part (b), so the amount of the polarized component of green color is estimated.

When focusing on the pixel surrounded by a thick line in Part (b), for example, the corresponding position (thick dotted line) of the first light detecting layer 12 depicted in Part (a) is surrounded by the hatched pixels having the polarized component in the same direction as that of the pixel in question. Consequently, they can be used to estimate with high accuracy the value of the polarized component in each pixel in Part (b). The estimated value may be the average value of pixel values of the surrounding four pixels, e.g., the hatched pixels in Part (a). Alternatively, estimation may be made by interpolation in a known method by utilizing values of polarized components having the same direction dispersing in a broader range.

The component-to-be-eliminated estimating unit 254 examines all the pixels of the detected value image of the inorganic photoelectric conversion layers 212*a* and 212*b* so as to estimate the polarized component of green color contained in the pixel value. Then the each-color image generating unit 256 subtracts the polarized component from each pixel value of the detected value image, thereby generating the image with pixel values having purely blue component. At this time, the polarized component of green which has been subtracted from blue color (or the estimated value of the polarized component of green which has utilized the detected value image of the first light detecting layer 12) is also generated as the image data.

After that, defect detection and correction are appropriately performed on the polarized image, and then the color image of natural light and the polarized image of green color are generated. The pixel value of green color among the color images of natural light is generated by summing up the detected value image after scale adjustment of the first light detecting layer 12 and the image of polarized component of green color which has been estimated by the component-to-be-eliminated estimating unit 254. Since both of them represent the polarized components that cross at right angles in the pixel at the same position, the summing up restores the original unpolarized light. The pixel value of blue color is obtained by subtracting the estimated value of the polarized component of green color from the detected value image of the inorganic photoelectric conversion layers 212*a* and 212*b*. As the pixel value of red color, the detected value image of the inorganic photoelectric conversion layers 214*a* and 214*b* can be used as it is.

The polarized image of green color is generated in the following way. The first step is to extract the polarized components in each direction which are discretely obtained in the detected value image of the first light detecting layer 12. Next, the pixels are appropriately displaced so that four polarized images which represent the polarized components in four directions at the same position are generated. Since the pixel values at this point are still discrete, the four polarized images undergo interpolation based on the distribution obtained from the high-frequency components of the image of unpolarized green light generated as described above. Thus, there is obtained the polarized image in four directions. The high-frequency components of the unpolarized image results in interpolation with high accuracy.

The following illustrates the technique to acquire the information of an object by means of the imaging apparatus mentioned above. Researches have been going on the technique to obtain the normal line on the surface of an object by using a polarizer or polarizing plate, as disclosed in PCT Patent Publication No. WO2009-147814, for example. According to this disclosure, a polarizing camera is used to catch the reflected light from the surface of an object and measure the polarization angle for the light with a minimum luminance. The result of measurements gives the angle of direction of the object surface. The observation in this manner is carried out at two different view points so as to uniquely determine the normal line of the object surface.

Figure 31:
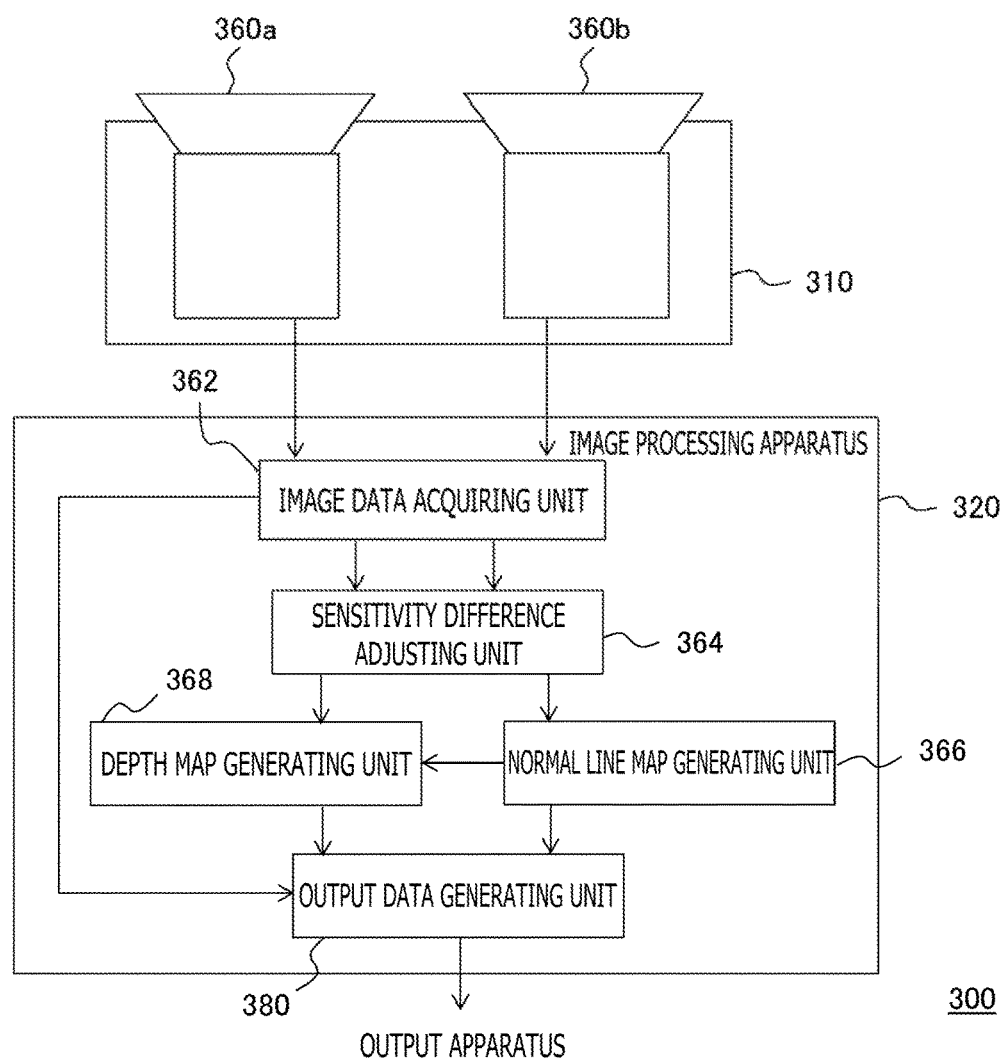
FIG. 31 is a diagram depicting an example of a structure of an image processing system according to the embodiment.

The imaging element according to the present embodiment is designed to obtain the polarization information and the information of natural light which are observed at the same view point aligned with individual pixels. This capability is useful to acquire various kinds of information and enhance the accuracy of image capture. FIG. 31 depicts an example of the structure of an image processing system according to the present embodiment. An image processing system 300 includes a stereo camera 310 and an image processing apparatus 320. Incidentally, the stereo camera 310 and the image processing apparatus 320 may be separate from each other and connected through wire or wireless communication for data transmission and reception as depicted in FIG. 31. Alternatively, both may be integrated into a single information processing apparatus having an internal bus for data transmission and reception.

The stereocamera 310 includes two imaging apparatuses having the same configuration as any of the imaging apparatuses as mentioned above which are arranged side by side a certain distance apart. The image processing apparatus 320 includes an image data acquiring unit 362 which acquires image data from the stereocamera 310, a sensitivity difference adjusting unit 364 which adjusts the difference in sensitivity between the left and right pieces of image data which have been acquired, a normal line map generating unit 366 which generates a normal line map based on the left and right polarized images, a depth map generating unit 368 which generates a depth map based on the left and right images of natural light and the normal line map, and an output data generating unit 380 which generates data to be output.

The image data acquiring unit 362 acquires the data of image of natural light and the data of image of polarized component from the imaging apparatuses 360*a* and 360*b* constituting the stereocamera 310. In other words, it acquires the data of image of natural light taken from the left and right view points and the data of polarized image in four directions taken from the left and right view points. In the case of video photographing, the image data acquiring unit 362 continues to acquire data at a prescribed frame rate. The thus acquired data is temporarily stored in a memory (not depicted) in a prescribed unit for each frame, so that the sensitivity difference adjusting unit 364 reads the data at appropriate timing. The sensitivity difference adjusting unit 364 adjusts the output levels for the paired images of natural light taken from the left and right view points and also adjusts the output levels for the paired polarized images in each direction taken from the left and right view points.

For example, the average luminance value for each image is calculated and one of the results is multiplied by a gain so that they become uniform in level. The gain used for the image of natural light may also be used as the gain for the polarized image taken from the same view point. The normal line map generating unit 366 uses the left and right polarized images of four directions to obtain a normal line vector on the object surface, and then maps the result on an image plane, thereby generating the normal line map. This procedure uses the above-mentioned conventional technique to acquire the normal line information of the object through the stereo polarized camera. The depth map generating unit 368 generates a depth map by using left and right images of natural light which have undergone level adjustment.

To be concrete, the corresponding point is detected from the left and right images of natural light, the distance from the imaging plane to the corresponding point is calculated by using the parallax based on the principle of triangulation, and the result is mapped on the image plane, thereby generating the depth map. The technique of generating the depth map from the stereo image has been in practical use with the conventional stereocamera. However, the conventional technique has difficulty in detecting features in the case of an object with a flat surface lacking patterns and wrinkles, which leads to errors in or incapability of distance calculations and results in a depth map with missing data.

In order to address this problem, the depth map generating unit 368 according to the present embodiment utilizes the normal line map generated by the normal line map generating unit 366, thereby improving the accuracy of the depth map. To be concrete, this is accomplished by acquiring the continuity of the object surface based on the distribution of the normal line vector. In this way, it is possible to specify whether or not the surrounding images represent the continuous same plane, even though the distances obtained by detecting the corresponding points are discrete ones. This permits calculation of the distance in the region where the corresponding points are not detected using the normal line vector.

Moreover, the depth map generating unit 368 may also use the polarized image for the detection of the corresponding points, thereby utilizing as the features the minute irregularities on the object surface which appear in the polarized image. In the case of the present embodiment, the position in the image of natural light coincides with the position in the polarized image for the pixel level in the stage of photographing and this obviates the necessity of aligning the position of both later. This leads to the ability to accurately acquire the depth map from any object which has only a few features at first glance.

The output data generating unit 380 selects necessary data from the data of the normal line map and depth map generated as mentioned above and the data of image of natural light which has been obtained by the image data acquiring unit 362 and outputs the thus selected data to an external output apparatus. Alternatively, it may perform prescribed information processing on such data, thereby generating the data for display image and voice to be output. The data to be output and the information processing to be performed may vary according to the purpose of the image processing system 300.

For example, the position of the object in the real space is specified by using the thus obtained accurate depth map, and the color image of natural light is modified or a game video screen that reacts to the object's movement is generated, accordingly. If the data of the image thus generated is output to a display as an output apparatus at appropriate timing, it is possible to display the video image that changes in response to the movement of the object. The mode of output is not restricted to that mentioned above.

According to the embodiment mentioned above, the imaging element includes the first light detecting layer and the second light detecting layer which are placed one over another, with the former being a film of an organic photoelectric conversion material oriented in a specific axial direction, and the latter being an element that absorbs light passing through the former and performs photoelectric conversion. This structure acquires at least two kinds of information, e.g., the polarized component in two directions or the polarized component in one direction and natural light, at the same position for individual pixels. Further, modification may be possible to make the organic photoelectric conversion material to vary in the absorption waveband, to add a color filter, and to combine the polarization information and the color information to acquire various kinds of information.

It is possible to acquire more than one kind of information simultaneously at the same position for individual pixels in this manner; this obviates the necessity for the process to align both at the time of acquiring the shape and position of the object by using the information. Moreover, there is not posed problems with aligning even for the object having limited features. Since several kinds of images are acquired at the same position, it is possible to use both complementarily, thereby improving the detailedness and accuracy of the image to be output eventually. To be concrete, the defects of the original detected value can be supplemented, the high-frequency component which has been lost in the course of internal processing can be restored, and unknown values can be estimated, for example. Moreover, the computation of several kinds of values at the same position generates data of new kind and hence acquires a variety of information as the result.

The method for generating the depth map using the ordinary stereo image of natural light sometimes results in a part where the corresponding point cannot be extracted and hence the distance value cannot be calculated. However, the embodiment mentioned above makes it possible to generate a detailed depth map because of the acquisition of polarized image at the same position. To be concrete, it makes it possible to acquire minute irregularities on the object surface as the polarization information and utilize them as features. If the distance values obtained from such features as corresponding points are discrete, it is possible to obtain a more detailed depth information in view of the continuous plane obtained from the normal line map.

It is possible to properly select the structure and material for the pixel region of more than one light detecting layer in compliance with the requirement for the manufacturing process such as easiness for orientation and the operational requirement for information and resolution. Such multiple demands can be complied to suit the occasion. Further, since the timing for data readout from more than one light detecting layer is independently controlled, it is possible to realize the processing system in which errors are reduced depending on the difference in sensitivity due to material and the distance to a wiring for readout, and information necessary at a minimal level is certainly acquired.

In the foregoing, the present invention has been described with reference to the embodiment thereof. The embodiment given above is a mere example, and it is understood by those skilled in the art that the embodiment may be variously modified by combination of the constituents and the processing steps and such modification is within the scope of the present invention.

For example, the present embodiment may be modified such that the first light detecting layer 12, which is an oriented organic photoelectric conversion film, is replaced by a carbon nanotube. There have recently been proposed a variety of polarizing elements which employ carbon nanotubes densely arranged in identical directions in place of the dichroic molecules oriented in a specific axial direction. Moreover, the technique to detect polarized light by means of carbon nanotubes is being studied as reported in the following literature: Xiaowei. He, et al., "Photothermoelectric p-n Junction Photodetector with Intrinsic Broadband Polarimetry Based on Macroscopic Carbon Nanotube Films," ACS Nano 7, 7271 (2013).

In this case, the first light detecting layer 12 has a structure in which carbon nanotubes are densely arranged and an electrode which reads out charges generated by the structure. In the case where color information is necessary, the first light detecting layer 12 may be covered with a color filter layer as depicted in FIG. 20. The use of carbon nanotubes produces the same effect as the present embodiment and further improves the sensitivity for image acquisition.

REFERENCE SIGNS LIST

10 Imaging element
12 First light detecting layer
16 Second light detecting layer
28 Imaging element
36 Upper electrode
38a Organic photoelectric conversion film
44a Lower electrode
54a Photoelectric conversion element
70 Image sensor
82 First layer detected value acquiring unit
84 Second layer detected value acquiring unit
85 Sensitivity difference adjusting unit
86 Defect correcting unit
88 Defect detecting unit
90 Natural light image generating unit
92 Polarized image generating unit
100 Imaging apparatus
160 Imaging apparatus
161 Image sensor
162 Second layer detected value acquiring unit
164 Luminance image generating unit
166 Color image generating unit
168 Polarized image generating unit
250 Color component control unit
252 Sensitivity difference adjusting unit
254 Component-to-be-eliminated estimating unit
256 Each-color image generating unit

INDUSTRIAL APPLICABILITY

As mentioned above, the present invention will find use for the imaging element, image sensor, imaging apparatus, information processing apparatus, image processing apparatus, and system containing any one of them.

The invention claimed is:
1. An imaging element comprising:
  a first light detecting layer comprising an organic photoelectric conversion film,
  wherein the organic photoelectric film is divided into a plurality of unit regions,
  wherein each unit region absorbs and measures a polarized component of incident light which is parallel to an orientation axis of the unit region, and
  wherein each unit region passes a polarized component of incident light which is perpendicular to the orientation axis of the unit region; and
  a second light detecting layer disposed under the first light detecting comprising an inorganic photoelectric conversion element,
  wherein the first light detecting layer includes a plurality of pixels,
  wherein each pixel comprises four unit regions arranged in two columns and two rows,
  wherein adjacent unit regions in each pixel have orientation axes aslant to each other at 45°, and
  wherein diagonal unit regions in each pixel have orientation axes which are perpendicular.

2. The imaging element as defined in claim 1, wherein the second light detecting layer has the inorganic photoelectric conversion element as a pixel which constitutes a unit smaller than one pixel or a unit of pixels in the first light detecting layer.

3. The imaging element as defined in claim 2, further comprising:
  a color filter layer disposed between the first light detecting layer and the second light detecting layer in which color filters that pass light of wavebands corresponding to different colors adjoin to each other.

4. The imaging element as defined in claim 2, further comprising:
  a color filter layer disposed on the first light detecting layer in which color filters that pass light of wavebands corresponding to different colors adjoin to each other.

5. The imaging element as defined in claim 4, wherein each unit region of each pixel comprises a separate color filter.

6. The imaging element as defined in claim 4, wherein the first light detecting layer has pixels such that a region of one pixel corresponds to a region containing part of each of a plurality of color filters adjoining to each other in the color filter layer.

7. The imaging element as defined in claim 1, wherein the organic photoelectric conversion film includes a material that performs photoelectric conversion on light of a specific waveband containing a waveband corresponding to a plurality of colors.

8. The imaging element as defined in claim 1,
  wherein the first light detecting layer includes a material that performs photoelectric conversion on light of a waveband corresponding to a prescribed color, and
  the second light detecting layer has the inorganic photoelectric conversion element as a pixel, with pixels in the first light detecting layer constituting a unit.

9. The imaging element as defined in claim 8, wherein the first light detecting layer further includes a non-oriented organic photoelectric conversion film which performs photoelectric conversion on light passing through the organic photoelectric conversion film and having a waveband same as a waveband of light absorbed by the organic photoelectric conversion film.

10. The imaging element as defined in claim 1, wherein the inorganic photoelectric conversion element of the second light detecting layer has a plurality of inorganic photoelectric conversion layers laminated one over another which perform photoelectric conversion on light of different wavebands.

11. An image sensor comprising:
a pixel unit configured to have imaging elements arranged in a matrix pattern, the imaging elements each including:
   a first light detecting layer configured to contain an organic photoelectric conversion film which is capable of (a) absorbing and measuring a polarized component of incident light which is parallel to an orientation axis of the imaging element and (b) passing a polarized component of the incident light which is perpendicular to the orientation axis of the imaging element; and
   a second light detecting layer disposed under the first light detecting layer and configured to contain an inorganic photoelectric conversion element; and
a row scanning unit to drive the imaging elements constituting the pixel unit in a prescribed sequence, thereby acquiring electrical signals, and output the electrical signals sequentially,
wherein the first light detecting layer includes a plurality of pixels,
wherein each pixel comprises four unit regions arranged in two columns and two rows,
wherein adjacent unit regions in each pixel have orientation axes aslant to each other at 45°, and
wherein diagonal unit regions in each pixel have orientation axes which are perpendicular.

12. An imaging apparatus comprising:
a processor configured to acquire from an image sensor data of an image including electrical signals from each detecting layer as a pixel value, the image sensor including:
   a pixel unit configured to have imaging elements arranged in a matrix pattern, the imaging elements each including:
      a first light detecting layer configured to contain an organic photoelectric conversion film which is capable of (a) absorbing and measuring a polarized component of incident light which is parallel to an orientation axis of the imaging element and (b) passing a polarized component of the incident light which is perpendicular to the orientation axis of the imaging element; and
      a second light detecting layer disposed under the first light detecting layer and configured to contain an inorganic photoelectric conversion element;
   a row scanning unit configured to drive the imaging elements constituting the pixel unit in a prescribed sequence, thereby acquiring electrical signals, and output the electrical signals sequentially; and
   a sensitivity difference adjusting unit configured to adjust a scale of a plurality of images expressed by the image data and perform prescribed computation based on the pixel value in corresponding regions, thereby generating data of an image for output,
wherein the first light detecting layer includes a plurality of pixels,
wherein each pixel comprises four unit regions arranged in two columns and two rows,
wherein adjacent unit regions in each pixel have orientation axes aslant to each other at 45°, and
wherein diagonal unit regions in each pixel have orientation axes which are perpendicular.

* * * * *